(12) United States Patent
Freedman et al.

(10) Patent No.: US 10,665,701 B2
(45) Date of Patent: May 26, 2020

(54) FORM AND FABRICATION OF SEMICONDUCTOR-SUPERCONDUCTOR NANOWIRES AND QUANTUM DEVICES BASED THEREON

(71) Applicant: Microsoft Technology Licensing, LLC, Redmond, WA (US)

(72) Inventors: Michael Hartley Freedman, Santa Barbara, CA (US); Bernard van Heck, Santa Barbara, CA (US); Georg Wolfgang Winkler, Santa Barbara, CA (US); Torsten Karzig, Santa Barbara, CA (US); Roman Lutchyn, Santa Barbara, CA (US); Peter Krogstrup Jeppesen, Frederiksberg (DK); Chetan Nayak, Santa Barbara, CA (US); Charles Masamed Marcus, Copenhagen (DK); Saulius Vaitiekėnas, Copenhagen (DK)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/120,434

(22) Filed: Sep. 3, 2018

(65) Prior Publication Data

US 2020/0027971 A1 Jan. 23, 2020

Related U.S. Application Data

(60) Provisional application No. 62/701,458, filed on Jul. 20, 2018.

(51) Int. Cl.
*H01L 39/02* (2006.01)
*H01L 29/66* (2006.01)
(Continued)

(52) U.S. Cl.
CPC .. *H01L 29/66977* (2013.01); *H01L 21/02603* (2013.01); *H01L 29/0676* (2013.01);
(Continued)

(58) Field of Classification Search
None
See application file for complete search history.

(56) References Cited

U.S. PATENT DOCUMENTS

| 8,209,279 B2 | 6/2012 | Freedman et al. |
| 9,040,959 B2 | 5/2015 | Lutchyn et al. |

(Continued)

FOREIGN PATENT DOCUMENTS

| WO | WO 2018/035360 | 2/2018 |
| WO | WO 2018/035361 | 2/2018 |

OTHER PUBLICATIONS

Aguado, "Majorana quasiparticle in condensed matter," *La Rivista del Nuovo Cimento*, vol. 40, 74 pp. (Oct. 2017).
(Continued)

*Primary Examiner* — Benjamin P Sandvik
(74) *Attorney, Agent, or Firm* — Klarquist Sparkman, LLP

(57) ABSTRACT

The disclosure relates to a quantum device and method of fabricating the same. The device comprises one or more semiconductor-superconductor nanowires, each comprising a length of semiconductor material and a coating of superconductor material coated on the semiconductor material. The nanowires may be formed over a substrate. In a first aspect at least some of the nanowires are full-shell nanowires with superconductor material being coated around a full perimeter of the semiconductor material along some or all of the length of the wire, wherein the device is operable to induce at least one Majorana zero mode, MZM, in one or more active ones of the full-shell nanowires. In a second aspect at least some of the nanowires are arranged vertically relative to the plane of the substrate in the finished device.

14 Claims, 23 Drawing Sheets

(51) Int. Cl.
| | |
|---|---|
| H01L 29/06 | (2006.01) |
| H01L 39/24 | (2006.01) |
| H01L 21/02 | (2006.01) |
| H01L 39/12 | (2006.01) |
| G06N 10/00 | (2019.01) |

(52) U.S. Cl.
CPC ........ *H01L 39/125* (2013.01); *H01L 39/2406* (2013.01); *G06N 10/00* (2019.01)

(56) References Cited

U.S. PATENT DOCUMENTS

| | | | |
|---|---|---|---|
| 10,346,348 | B2 | 7/2019 | Hastings et al. |
| 2012/0112168 | A1* | 5/2012 | Bonderson ............. G06N 10/00 257/31 |
| 2013/0299783 | A1 | 11/2013 | Lutchyn et al. |
| 2017/0061317 | A1* | 3/2017 | Chow ..................... H01L 25/04 |
| 2017/0133576 | A1* | 5/2017 | Marcus ................. H01L 39/223 |
| 2017/0141287 | A1* | 5/2017 | Barkeshli ............. H01L 39/223 |
| 2018/0052806 | A1 | 2/2018 | Hastings et al. |
| 2018/0053113 | A1* | 2/2018 | Lutchyn ................. G06N 10/00 |
| 2018/0053809 | A1 | 2/2018 | Freedman et al. |
| 2019/0214561 | A1* | 7/2019 | Schrade ................. B82Y 10/00 |

OTHER PUBLICATIONS

Alicea, "New directions in the pursuit of Majorana fermions in solid state systems," *Reports on Progress in Physics*, vol. 75, No. 7, 36 pp. (Jun. 2012).
Antipov et al., "Effects of Gate-Induced Electric Fields on Semiconductor Majorana Nanowires," *Physical Review X*, vol. 8, No. 3, 18 pp. (Aug. 2018).
Beenakker, "Search for Majorana fermions in superconductors," *Annual Review of Condensed Matter Physics*, vol. 4, 15 pp. (Apr. 2013).
Brouwer, "Enter the Majorana Fermion," *Science*, vol. 336, No. 6084, pp. 989-990 (May 2012).
Caroli et al., "Bound Fermion States on a Vortex Line in a Type II Superconductor," *Physics Letter*, vol. 9, No. 4, pp. 307-309 (May 1964).
Chiu et al., "Vortex Lines in Topological Insulator-Superconductor Heterostructures," *Physical Review B*, vol. 84, No. 4, 10 pp. (Oct. 2011).
Cochran et al., "Superconducting Transition in Aluminum," *Physical Review*, vol. 111, No. 1, pp. 132-142 (Jul. 1958).
Cook et al., "Majorana Fermions in a Topological-Insulator Nanowire Proximity-Coupled to an S-Wave Superconductor," *Physical Review B*, vol. 84, pp. 1-4 (Nov. 2011).
Das Sarma et al., "Majorana Zero Modes and Topological Quantum Computation," *NPJ Quantum Information*, vol. 1, No. 15001, 16 pp. (Oct. 2015).
Fu et al., "Superconducting Proximity Effect and Majorana Fermions at the Surface of a Topological Insulator," *Physical Review Letters*, vol. 100, No. 9, 4 pp. (Mar. 2008).
Groth et al., "Kwant: a software package for quantum transport," *New Journal of Physics*, vol. 16, 40 pp. (Jun. 2014).
Hosur et al., "Majorana Modes at the Ends of Superconductor Vortices in Doped Topological Insulators," *Physical Review Letters*, vol. 107, 5 pp. (Aug. 2011).
International Search Report and Written Opinion dated Oct. 9, 2019, from International Patent Application No. PCT/US2019/040000, 16 pp.
International Search Report and Written Opinion dated Oct. 9, 2019, from International Patent Application No. PCT/US2019/039993, 16 pp.
Karzig et al., "Scalable designs for quasiparticle-poisoning-protected topological quantum computation with Majorana zero modes," Phys. Rev. B, 95, 235305, 34 pages (2017).
Kitaev, "Unpaired Majorana fermions in quantum wires," *Physics—Uspekhi*, vol. 44, No. 131, pp. 131-136 (Oct. 2001).
Krogstrup et al., "Epitaxy of semiconductor-superconductor nanowires," *Nature Materials*, vol. 14, No. 4, pp. 400-406 (Apr. 2015).
Larkin, "Superconductor of Small Dimensions in a Strong Magnetic Field," *Soviet Physics Jetp*, vol. 21, No. 1, pp. 153-159 (Jul. 1965).
Leijnse et al., "Introduction to topological superconductivity and Majorana fermions," *Semiconductor Science and Technology*, vol. 27, No. 12, 21 pp. (Nov. 2012).
Little et al., "Observation of Quantum Periodicity in the Transition Temperature of a Superconducting Cylinder," *Physical Review Letters*, vol. 9, No. 1, 7 pp. (Jul. 1962).
Liu et al., "Destruction of the Global Phase Coherence in Ultrathin, Doubly Connected Superconducting Cylinders," *Science*, vol. 294, No. 5550, pp. 2332-2334 (Dec. 2001).
Lutchyn et al., "Majorana Fermions and a Topological Phase Transition in Semiconductor-Superconductor Hetereostructures," arXiv:1002.4033v2, 5 pp. (Feb. 2010).
Lutchyn et al., "Majorana zero modes in superconductor-semiconductor heterostructures," Nat. Rev. Mater. 3, pp. 52-68 (2018).
Lutchyn et al., "Realizing Majorana zero modes in superconductor-semiconductor heterostructures," arXiv:1707.04899v1, 18 pp. (Jul. 2017).
Lutchyn et al., "Topological superconductivity in full shell proximitized nanowires," arXiv:1809.05512v1, 12 pp. (Sep. 2018).
Mourik et al., "Signatures of Majorana fermions in hybrid superconductor-semiconductor nanowire devices," *Science*, vol. 336, No. 6084, 28 pp. (May 2012).
Nayak et al., "Non-Abelian Anyons and Topological Quantum Computation," *Modern Physics*, vol. 80, 73 pp. (Sep. 2008).
Notice of Allowance dated Sep. 23, 2019, from U.S. Appl. No. 16/120,433, 9 pp.
Oreg et al., "Helical Liquids and Majorana Bound States in Quantum Wires," *Physical Review Letter*, vol. 105, No. 17, 4 pp. (Oct. 2010).
Pientka et al., "Topological Superconductivity in a Planar Josephson Junction," *Physical Review X*, vol. 7, 16 pp. (May 2017).
Romito et al., "Manipulating Majorana fermions using supercurrents," *Physical Review B*, vol. 85, 5 pp. (Jan. 2012).
Sau et al., "A generic new platform for topological quantum computation using semiconductor heterostructures," *Physical Review Letters*, vol. 104, 4 pp. (Jan. 2010).
Stanescu et al., "Majorana Fermions in Semiconductor Nanowires," *Physical Review B*, vol. 84, No. 14, 29 pp. (Oct. 2011).
Stanescu et al., "Robust topological phase in proximitized core-shell nanowires coupled to multiple superconductors," *Journal of Nanotechnology*, vol. 9, pp. 1512-1526 (May 2018).
Stern, "Non-Abelian states of matter," *Nature*, vol. 464, pp. 187-193 (Mar. 2010).
Van Heck et al., "Single fermion manipulation via superconducting phase differences in multiterminal Josephson junctions," *Physical Review B*, vol. 90, 9 pp. (Oct. 2014).
Wilczek, "Majorana returns," *Nature Physics*, vol. 5, pp. 614-618 (Sep. 2009).
Winkler et al., "Orbital Contributions to the Electron g Factor in Semiconductor Nanowires," *Physical Review Letters*, vol. 119, 6 pp. (Jul. 2017).

* cited by examiner

FORM AND FABRICATION OF SEMICONDUCTOR-SUPERCONDUCTOR NANOWIRES AND QUANTUM DEVICES BASED THEREON

CROSS REFERENCE TO RELATED APPLICATION

This patent application claims the benefit of U.S. Provisional Patent Application No. 62/701,458, filed Jul. 20, 2018 and entitled "Form And Fabrication Of Semiconductor-Superconductor Nanowires And Quantum Devices Based Thereon", the disclosure of which is hereby incorporated by reference.

BACKGROUND

Quantum computing is a class of computing in which inherently quantum mechanical phenomena, such as quantum state superposition and entanglement, are harnessed to perform certain computations far more quickly than any classical computer could ever be capable of. In a "topological" quantum computer, calculations are performed by manipulating quasiparticles—called "non-abelian anyons" that occur in certain physical systems. Anyons have unique physical characteristics that distinguish them from both fermions and bosons. Non-abelian anyons also have unique properties with respect to abelian anyons. It is these unique properties that serve as a basis for topological quantum computing, in which information is encoded as a topological property of non-abelian anyons; specifically the braiding of their space-time worldlines. This has certain benefits over other models of quantum computation. One key benefit is stability, as the quantum braiding is unaffected by perturbations on a scale that could cause error-inducing quantum decoherence in other types of quantum computer.

A number of types of physical system have been considered as potential hosts of non-abelian anyons, such as "5/2 fractional quantum Hall" systems in condensed matter physics, and systems of topological insulators in contact with superconductors. Another example is semiconductor-superconductor (SE/SU) heterostructures such as SE/SU nanowires. With regard to these, a key advance in the field was the realization that non-abelian anyons, in the form of "Majorana zero modes" (MZMs), can be formed in regions where semiconductor (SE) is coupled to a superconductor (SU). Based on this phenomenon, a small network of SE/SU nanowires can be used to create a quantum bit, wherein each SE/SU nanowire comprises a length of semiconductor coated with a superconductor.

A quantum bit, or qubit, is an element upon which a measurement with two possible outcomes can be performed, but which at any given time (when not being measured) can in fact be in a quantum superposition of the two states corresponding to the different outcomes.

A "topological" qubit is a qubit implemented based on the above-mentioned technology of non-abelian anyons in the form of MZMs. A non-abelian anyon is a type of quasiparticle, meaning not a particle per se, but an excitation in an electron liquid that behaves at least partially like a particle. Particularly an anyon is a quasiparticle occurring in a two-dimensional system (two degrees of freedom in space). A Majorana zero mode is a particular bound state of such quasiparticles. Under certain conditions, these states can be formed close to the semiconductor/superconductor interface in an SE/SU nanowire network, in a manner that enables them to be manipulated as quantum bits for the purpose of quantum computing. Regions or "segments" of the nanowire network between the MZMs are said to be in the "topological" regime.

A Majorana-based qubit conventionally involves gating in order to exhibit such topological behaviour. That is, an electrical potential is applied to a segment of the semiconductor of one of the nanowires forming the qubit. The potential is applied via a gate terminal placed adjacent to the nanowire in the fabricated structure on the wafer. A magnetic field is also required to induce the topological regime. The magnetic field is applied from an electromagnet placed outside the wafer, typically within the refrigerating compartment as used to induce the superconductivity in the superconductor.

Conventionally, building Majorana-based topological quantum computing devices involves the formation of superconducting islands on the semiconductor. Some parts of the superconductor are topological (T) and some parts of which are non-topological (e.g., conventional S-wave (S)). The topological segment supports Majorana zero modes appearing at its opposite ends. The existing techniques for realizing MZMs require strong magnetic fields as well as electrostatic gating in order to drive the half-shell nanowires into the topological phase. The MZMs are induced by a coupling of the magnetic field to the spin component of the electrons. This requires a strong magnetic field.

In some fabrication techniques, the semiconductor of the nanowires may be formed in the plane of the wafer by a technique such as selective area growth (SAG). The superconducting material may then be deposited selectively over the semiconductor, or may be deposited as a uniform coating and regions subsequently etched away to form the islands.

Another method of fabricating a device comprising semiconductor-superconductor nanowires is disclosed in "Epitaxy of semiconductor-superconductor nanowires", P. Krogstrup et al, Nature Materials, 12 Jan. 2015, pages 400-406. The semiconductor cores of the nanowires are grown vertically relative to the plane of the wafer, and then angle deposition is performed in order to deposit a coating of superconductor on facets of the semiconductor core. The nanowires are then "felled" by sonication and aligned in the horizontal plane by means of optical microscopy. Parts of the superconductor coatings are then etched away from the nanowires so as, in the resultant device, to leave each nanowire coated with just the superconducting islands mentioned above.

SUMMARY

According to a first aspect disclosed herein, it is disclosed to coat the full perimeter of each nanowire with superconductor, i.e. to provide a full superconducting shell, and to leave this shell in place the final device (rather than etching away portions of the superconductor or depositing it selectively to form only superconducting islands over the semiconductor of the wire). This full-shell coating may be implemented for example by rotating the substrate or the deposition beam during deposition of the superconductor. With a full shell, the inventors have discovered that only a relatively weak orbital magnetic field is needed to drive the system into the topological regime. The disclosed formation may also be used to mitigate other technological challenges present in earlier schemes, in that it avoids electrostatic tuning into topological phase, protects topological elements from spatial inhomogeneities, and increases charging energy of the superconducting island forming part of the qubit.

The disclosed formations can be used to build quantum computing structures, such as to form topological qubits, qubit systems, and quantum computers based on full shell nanowires, including but not limited to the example designs illustrated later. Example designs include "horizontal" and "vertical" designs.

According to a second aspect, there is disclosed a structure in which vertically grown nanowires are left in the vertical orientation relative to the wafer in the final device, rather than being felled and oriented horizontally in the plane of the wafer as in the prior techniques. An advantage of this is that it allows for 3D integration. Current approaches require that the nanowires are laid out flat in a 2D network in the plane of the wafer, but this takes up a lot of space. Instead therefore, the present disclosure discloses an approach in which the nanowires are left standing vertically in the orientation they were grown in, and then the rest of the device is built around them.

The first and second aspects may be used together or independently. I.e. in the first aspect the nanowires may be left vertical or felled and aligned horizontally in the plane of the wafer; whilst in the second aspect, the nanowires may be left as full-shell nanowires or may be etched to remove portions of the superconductor from the wires.

In either aspect the disclosed structure may be used to form a topological qubit or a topological computer or universal quantum computer comprising multiple qubits. In the second aspect, the disclosed structure may even be useful in forming other, non-topologic quantum devices.

Note that a "device" as referred to herein means a finished device, i.e. a device formed in a finished die or chip. Typically the device would also be packaged, i.e. in an integrated circuit package.

Note also that terms such as "horizontal", "vertical", "bottom" and "top" as referred to herein are meant relative to the plane of the wafer or substrate. I.e. horizontal means parallel to the plane of the substrate and vertical means perpendicular to the pane of the substrate, while bottom means at the end of the nanowire closest to the substrate and top means the end farthest from the substrate. These terms do not necessarily imply anything about the orientation with respect to gravity.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Nor is the claimed subject matter limited to implementations that solve any or all of the disadvantages noted herein.

BRIEF DESCRIPTION OF THE DRAWINGS

To assist understanding of embodiments of the disclosure and to show how such embodiments may be put into effect, reference is made, by way of example only, to the accompanying drawings in which.

GLOSSARY OF MATHEMATICAL SYMBOLS

Figure 1:
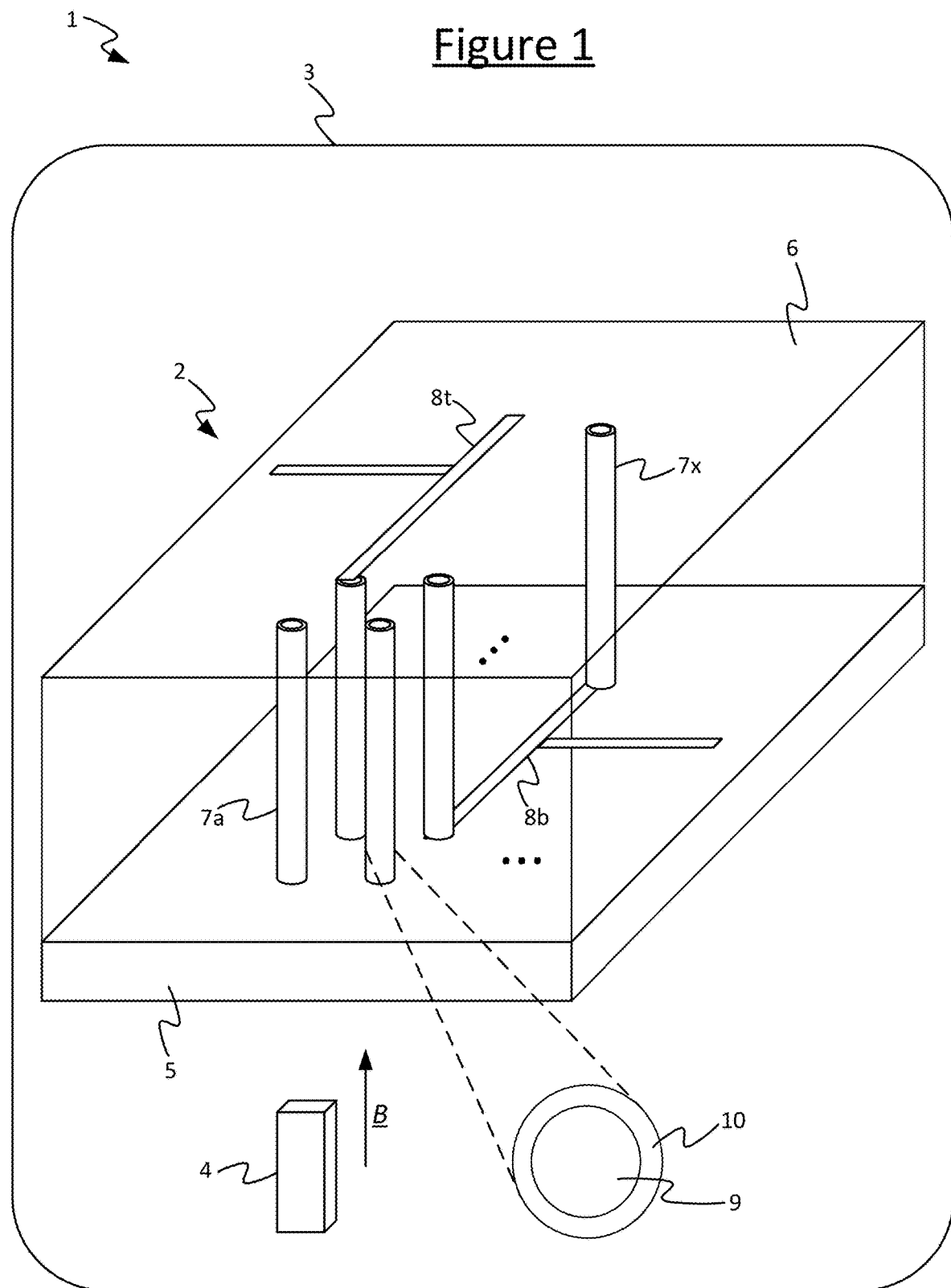
FIG. 1 is an illustration of a quantum system.

The following symbols are referred to herein:
$\hat{Z}$: direction of the nanowire
$\vec{r}$: direction radial to the nanowire
$R_1$: (optional) insulating core radius
$R_2$: semiconductor radius
$R_3$: outer radius of superconducting shell
$R$: thin shell radius
$\vec{B}$: magnetic field applied to nanowire
$\vec{A}$: electromagnetic vector potential
$H_0$: Hamiltonian for the semiconducting core
$e$: electric charge of an electron
$m^*$: effective mass
$\mu$: chemical potential
$\alpha_r$ or $\alpha$: strength of the spin-orbit coupling $\sigma_i$: spin ½ Pauli matrices
$\Delta_0$: s-wave superconducting pairing potential
$\psi$: Nambu basis
$H_{BdG}$: Hamiltonian for the proximitized nanowire
$\vec{p}$: momentum
d: thickness of the superconductor shell
$\lambda_L$: London penetration depth
$\Phi$: magnetic flux
$\Phi_0$: magnetic flux quantum
$\varphi$ or $\phi$: Angular coordinate
$n \in \mathbb{Z}$: winding number
$n_{eff}$: prefactor of the effective Zeeman term
$\tau_i$: Pauli matrices representing particle/hole degrees of freedom in Nambu space
  $m_J$ or $m_j$: or angular quantum number
  U: Unitary transformation
  $E_{gap}$: bulk energy gap
  $V_Z$: Zeeman energy
  $E_C$: charging energy
  $J_z$: angular momentum operator
  $L_z$: orbital angular momentum
  $\psi$: Majorana wavefunction
  $\zeta$: frequency of coherence lengths
  $m_e$: mass of an electron

DETAILED DESCRIPTION OF EMBODIMENTS

The present disclosure introduces calculations and simulations showing that over a wide range of values of B field, spin-orbit coupling, chemical potential, radius and temperature, then semiconductor wires with a full shell of superconductor can enter the topological phase which supports MZMs, the key element in the topological approach to quantum computation.

This prompted a flurry of further theoretical activity by the inventors cumulating in solid analytical verification of the topological phase, extensive numerical simulation of the parameters which determine access to the phase, and practical characteristics of the phase (coherence length and gap). Then with the full shell road to MZMs in hand, the inventors turned to the question, "Could this new full shell technology be exploited in the design of qubits, arrays of qubits, and all the way to a scalable architecture for a topological quantum computer?" The inventors found that, indeed, the answer to all these questions is "yes". This disclosure includes the theoretical work supporting the discovery of scalable designs for topological quantum computer based on full shell wires.

In fact there are at least two aspects to the present disclosure: I) what can be done with the now-known topological phase in full shell wires, and II) what can be done with vertical "forests" of vapor liquid solid (VLS) grown nanowires as quantum computing elements.

A linkage between I) and II) is that, in developing a scalable technology for full shell wires, the inventors realized that since the wires grow (VLS) in beautiful, orderly, vertical arrays, it would be a pity to ever have to knock them over. It is therefore disclosed to leave the forest in place and build the rest of the topological quantum computer around it. (Though horizontal designs are also possible in the first aspect.) Once headed down the path of achieving 3D integration of quantum computing elements though vertical forests of VLS wires, the inventors realized that there were fruitful applications even outside the topological realm. Conventional condensed matter qubits, such as transmons and gatemons will have limited fidelity and will have to be produced in the millions for quantum computers based on these to be able to support the necessary layers of error correction. It is recognized herein that vertical forests of semiconductor wires have the potential to be used to form dense arrays of majorana based qubits or conventional qubits.

FIG. 1 gives a schematic illustration of an example system 1 in accordance with embodiments of the present disclosure. For example the system 1 may be a quantum computer such as a topological quantum computer or universal quantum computer. The system 1 comprises a device 2 in the form of a die (chip) disposed within a refrigerated chamber 3. The die may be packaged in an integrated circuit (IC) package (not shown) and may be connected to external equipment (also not shown) via pins of the package, the equipment being arranged to control and/or take measurements from the device via contacts between the interior and exterior of the device 2. The system 1 further comprises an electromagnet 4, typically disposed within the refrigerated chamber 3.

The device 2 has been formed from a wafer using layered fabrication processes. The device 2 comprises a substrate 5 which defines a plane. The device 2 further comprises one or more layers 6 formed over the substrate 5. These may comprise for example a dielectric layer formed over the substrate 5, a layer of semiconductor material formed over the dielectric layer, a layer of semiconductor material formed over the semiconductor layer, and a layer of filler material formed over the superconductor layer.

The device 2 comprises one or more semiconductor-superconductor nanowires 7, preferably a plurality of such wires. The wires 7 are embedded in one or more of the layers 6. Each of the nanowires 7 comprises a length of semiconductor material 9 (the core of the nanowire 7) defining an axis. The core may be circular, elliptical or polygonal in cross section (i.e. the shape in the lane perpendicular to the axis of the wire). Each nanowire 7 further comprises a coating of superconducting material 10 formed over at least part of the exterior of the length of the nanowire. According to the first aspect disclosed herein, the superconductor material 10 is formed all the way around the perimeter (e.g. circumference) of the semiconductor core 9 in the plane of the axis (i.e. in cross section), along part or all of the length of the nanowire (part of all of the way along the axis in the direction parallel to the axis). This is what is meant by a full-shell nanowire. One, some or all of the nanowires 7 in the device 2 may take the form of full-shell nanowires.

To fabricate such formations, the semiconductor cores 9 of the nanowires 7 may be grown vertically for example using the growth method previously disclosed by Krogstrup et al, as cited in the background section. Vertical here means perpendicular to the plane of the substrate 5. The superconductor material 10 may then be deposited on the core 9 by means of an angled beam deposition technique. To form the full shell coating, either the wafer or the beam may be rotated during the deposition of the superconductor 10. The semiconductor material 9 is preferably a material with a high spin-orbit coupling, such as InAs (indium arsenide) or InSb (Indium antimonide). The superconductor material 10 is preferably an s-wave superconductor such as Al (aluminium) or Nb (Niobium).

According to the second aspect disclosed herein, the vertical nanowires 7 may be left in the vertical position in the finished device 2. To physically support the vertical nanowires, the deposited layers 6 include one or more layers of filler material, which may for example be a plastic or wax. E.g. the filler may be the plastic PMMA.

Alternatively some or all of the nanowires 7 (e.g. full-shell nanowires) may be felled and have their axis aligned in the horizontal plane (parallel to the substrate 5) in accordance with the previously known approach disclosed by Krogstrup et al.

In the final system 1, then one, some or all of the nanowires 7a (e.g. some or all of the vertical nanowires) are used as active nanowires, i.e. operative quantum components of a quantum structure such as a qubit. For example one, some or all of the nanowires 7 may be used to induce Majorana zero modes within the nanowire 7, which can be used to form a structure that acts as a Majorana based qubit. As will be discussed in more detail later, in embodiments bunches of vertical nanowires 7a can be used to form qubit structures such as quad qubits (tetron qubits) or hexon qubits. In other embodiments the nanowires 7 could be used to form other kinds of qubit such as transmon or gateman based qubits.

In embodiments all of the nanowires 7, or at least all of the active nanowires 7a, may be aligned with their axes in the same direction, i.e. parallel to one another.

Formed in one or more of the layers 6 are one or more layers of circuitry 8, which may for example comprise one or more gates, interconnects, semiconductor networks, and/or other electrical contacts 8. In embodiments, some or all of any semiconductor used in the circuitry 8 may be formed from the same semiconductor material 9 as the cores of the nanowires 7. In embodiments, some or all of any conductors used in the circuitry 8 may be formed from the same superconductor material 10 as the coating of the nanowires 7. The layer(s) of circuitry 8 may for example be arranged to enable any or all of: connecting together the nanowires 7 into quantum structures such as qubits, controlling the nanowires 7 or quantum structures formed therefrom, and/or taking readings from the nanowires or quantum structures formed therefrom. For instance the gates may be arranged to tune the semiconductor (to form dots, tunnel junctions, or appreciable electron density in the semiconductor) in regions without superconductor. E.g. the gates may be arranged for tuning tunnel junctions in a semiconducting network of the circuitry 8.

Some of the nanowires 7x are not necessarily used as operative quantum components and instead are simply exploited as vertical electrical contacts, i.e. vias, between layers of circuitry 8 in the structure 6 and/or to make external contact out of the top of the device 2, e.g. for connecting to pins of the package and ultimately the external equipment. Alternatively or additionally more traditional vias may be used.

FIG. 1 illustrates for example a bottom layer of circuitry 8b which may be formed from the base layer of semiconductor and/or superconductor, formed directly over the substrate 5 or with only a layer of dielectric before meeting the substrate 5. The conductor of this layer 8b may for example be formed form the same superconductor and in the seamed position step as the islands of superconductor connecting together nanowires of the qubits (see later). FIG. 1 also shows an example top layer or circuitry 8t formed over the top of the filler layer. This layer may for example comprise contacts to the exterior of the device, such as for connecting to the external equipment (not shown). FIG. 1 also illustrates one or more non-active vertical nanowires 7x not used for their properties as quantum components, instead exploited as vias between the upper and lower layers of circuitry 8b, 8t. A similar technique could be used to connect to intermediate layers of circuitry part way through the layers 6 of the device.

Note: in some embodiments control lines or other such circuitry 8 can be formed in different layers, as each qubit requires a lot of gates and space very quickly becomes limited.

It will be appreciated that the layers of circuitry 8 and indeed the arrangement of nanowires 7 shown in FIG. 1 are highly schematized, and are intended to illustrate the principle rather than an actual circuit or quantum structure. Note also that FIG. 1 is not intended to show the nanowires 7 as necessarily being disposed directly on the substrate 5. E.g. there may be one or more layers between the substrate 5 and the nanowires 7, e.g. a layer of dielectric.

A device 2 having the form described above can be used to implement a topological quantum computer based on Majorana zero modes (MZMs). In operation the chamber 2 is cooled to a temperature at which the superconductor material 10 in the active nanowires 7a exhibits superconductivity, and the electromagnet 4 is operated to apply a magnetic field B in the direction parallel to the axis of the nanowires 7a, or at least having a substantive component in the direction parallel to the axes of the active nanowires 7a. This induces one or more MZMs in each of the active nanowires 7a, enabling them for example, to play their part as part of a MZM based qubit or network of such qubits. In embodiments a pair of MZMs is induced, one at each end of the nanowire. In embodiments employing vertical nanowires 7, the MZM appearing at the bottom end (closest to the substrate 5) may be exploited to provide the desired quantum operation, e.g. as part of the quantum qubit.

Note that in the disclosed full-shell arrangement, then unlike conventional nanowires, it is not necessary to tune the full shell wires 7 into or out of the topological phase by an electrostatic potential, since the superconducting shell 10 is fully screening any electric field to the inside. The active full-shell wires 7a that are to be topological instead have a reproducible growth such that the full shell wire can enter the topological phase. Given the discovery disclosed herein that full-shell nanowires support MZMs, it is possible to select analytically or through experimentation suitable values of B field, spin-orbit coupling, chemical potential, radius and temperature from across a wide range of values such that these parameters are inside the topological phase (e.g. see FIGS. 1-4 and 16-19A and associated working). The inventors have performed simulations demonstrating that the topological phase can be obtained across a wide range of such parameters (see also FIGS. 19B and 24B). Further, the topological phase can be induced using only a much weaker magnetic field B than required in previous devices. The field is applied along the wire direction. The minimal value depends on the radius of the wire but is typically around 100 mT. This is different from half-shell nanowires where part of the nanowire is not covered by the superconductor shell and an electric field penetrates into the semiconducting core.

It may still be involved in the full shell case is to control the charging energy of the Majorana qubits and electrostatically change the induced charge on the island. In order to do so only weak electric fields are required whereas in order to change the band structure one needs to apply very large electric fields. This refers to gating of superconducting islands (e.g. by one or two electrons) connecting the nanowires 7, which may be required to control the charge of the islands to protect form quasiparticle poisoning and enable read out (which is much easier than gating to change the chemical potential of the semiconductor to induce the topological phase as in the partial-shell case, which in any case is not possible in full-shell case as the semiconductor is fully screened by the superconductor). The islands in question may for example be formed in the lower layer of circuitry 8*b*, where each island connects together a set of active nanowires 7*a* into a qubit (see later). This gating can be done anywhere in the island for example by gating the full shell wires and/or the superconducting structures (e.g. spirals) connecting the full-shell wires. The electric field can be applied through a gate that is close the full shell wire. Where the gate is exactly does not matter. Preferably the gate should only be close to a small part of the area of the full shell surface (although a larger area increases the coupling to the gate, thus reducing the required voltage changes).

Figure 1A:
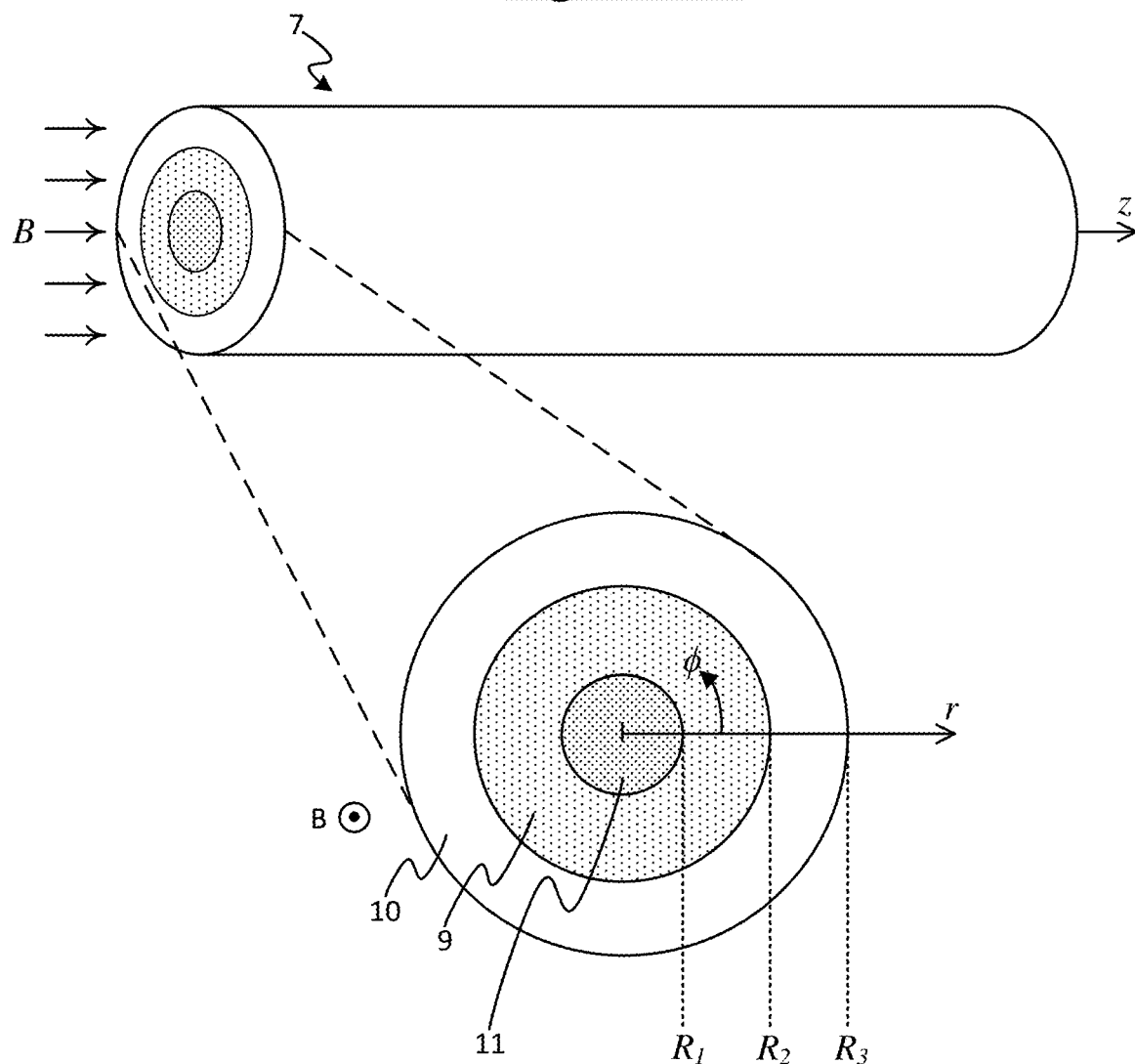
FIG. 1A is an illustration of a semiconducting nanowire with a full superconducting shell.

FIG. 1A illustrates a semiconducting nanowire core 9 with a full superconducting shell 10, subject to a weak axial magnetic field B. The centre region indicates the possible presence of an optional insulating (sub-)core 11 within the semiconductor core 9 (axial with the semiconductor core 9 along its centre axis). $R_1$ is the radius of the outer limit of the insulating sub-core 11 (if present) from the central axis of the nanowire 7 (and the inner limit of the semiconductor core 9). $R_1$ may equal 0. $R_2$ is the radius of the outer limit of the semiconductor 9 core from the central axis of the nanowire 7 (and the inner limit of the superconductor coating 10). $R_3$ is the radius of the outer limit of the superconductor coating 10 (and of the nanowire itself).

The Hamiltonian for such a full shell nanowire with radial spin-orbit coupling can be modelled as follows.

$$H_{BdG} = \left[\frac{p_z^2}{2m^*} + \frac{p_r^2}{2m^*} + \frac{(p_\varphi + eA_\varphi \tau_z)^2}{2m^*} - \mu\right]\tau_z - \alpha_r \sigma_z \tau_z (p_\varphi + eA_\varphi \tau_z) + \alpha_r p_z (\sigma_y \cos\varphi - \sigma_x \sin\varphi)\tau_z + \Delta_0(r)[\cos(n\varphi)\tau_x + \sin(n\varphi)\tau_y]$$

The first term $$\left[\frac{p_z^2}{2m^*} + \frac{2_r^2}{2m^*} + \frac{(p_\varphi + eA_\varphi \tau_z)^2}{2m^*} - \mu\right]\tau_z$$

represents the kinetic energy. The middle two terms $-\alpha_r\sigma_z\tau_z(p_\varphi + eA_\varphi\tau_z) + \alpha_r p_z(\sigma_y \cos\varphi - \sigma_x \sin\varphi)\tau_z$ represent the radial spin-orbit field. The last term $\Delta_0(r)[\cos(n\varphi)\tau_x + \sin(n\varphi)\tau_y]$ represents the pairing with winding number n.

The system has rotational symmetry: the above BdG (Bogoliubov de Genes) Hamiltonian commutes with the following generalized angular momentum operator:

$$J_z = L_z + \frac{1}{2}\sigma_z + \frac{1}{2}n\tau_z, [J_z, H_{BdG}] = 0$$

where $L_z$ is the orbital angular momentum. Hence one obtains a quantum number labelling of angular momentum states:

$$m_J \in \begin{cases} \mathbb{Z} & \text{for } n \text{ odd} \\ \mathbb{Z} + 1 & \text{for } n \text{ even} \end{cases}$$

To obtain an angle-independent Hamiltonian, angular dependence can be removed by performing the following unitary transformation.

$$H_{BdG} \to \exp\left[-i\left(m_J - \frac{1}{2}\sigma_z - \frac{1}{2}n\tau_z\right)\phi\right] H_{BdG} \exp\left[i\left(m_J - \frac{1}{2}\sigma_z - \frac{1}{2}n\tau_z\right)\phi\right]$$

In each $m_J$ sector the Hamiltonian takes the form:

$$\tilde{H}_{BdG} = \left(\frac{p_z^2}{2m^*} + \frac{p_r^2}{2m^*} - \mu\right)\tau_z + \frac{1}{2m^*r^2}\left(m_J - \frac{1}{2}\sigma_z - \frac{1}{2}n\tau_z + \frac{eBr^2}{2}\tau_z\right)^2 \tau_z - \frac{\alpha_r}{r}\sigma_z\tau_z\left(m_J - \frac{1}{2}\sigma_z - \frac{1}{2}n\tau_z + \frac{eBr^2}{2}\tau_z\right) + \alpha_r p_r \sigma_y \tau_z + \Delta_0(r)\tau_x$$

Note that the Rashba term $$\left(-\frac{\alpha_r}{r}\sigma_z\tau_z\left(m_J - \frac{1}{2}\sigma_z - \frac{1}{2}n\tau_z + \frac{eBr^2}{2}\tau_z\right) + \alpha_r p_r \sigma_y \tau_z\right)$$

representing the strength of the Rashba coupling does not average out to zero. In other words the spin orbit coupling) does not cancel out. Another way to check this is to investigate angular dependence of the eigenvectors in the original basis averaging of the spin-orbit (SO) term is non-zero due to the non-trivial winding with φ.

Figure 1B:
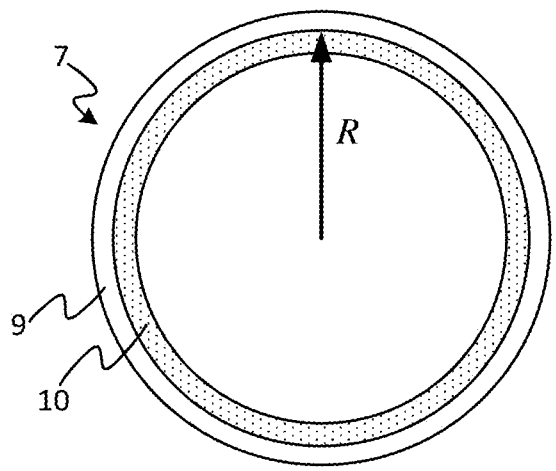
FIG. 1B is an illustration of a semiconducting nanowire with a thin shell.

FIG. 1B illustrates the thin shell limit where $R_1 \to R_2 = R$. The following gives the solution for the $m_J=0$ sector and n=1. Consider the case of $m_J=0$ and n=1, and a thin shell of radius R consisting of a hollow semiconductor 9 and a superconducting shell 10 as shown in FIG. 1B.

The Hamiltonian becomes simplified:

$$\tilde{H}_{BdG}^{(m_J=0)} = \left(\frac{p_z^2}{2m^*} - \mu(R)\right)\tau_z + V_Z(R)\sigma_z + \alpha_r p_r \sigma_y \tau_z + \Delta_0(r)\tau_x$$

where $\mu(R) = \mu - \frac{1-n_{eff}^2}{8m^*R^2} - \frac{\alpha_r}{2R}$ and $V_Z(R) = n_{eff}\left(\frac{1}{4m^*R^2} + \frac{\alpha_r}{2R}\right)$.

$\mu(R)$ is the renormalized chemical potential, and $V_Z(R)$ is the effective Zeeman term where $$n_{eff} = n - \frac{\pi BR^2}{\Phi_0}.$$

The penultimate term $\alpha_r p_r \sigma_y \tau_z$ is the effective Rashba SO term, which does not commute with the Zeeman term. The last term $\Delta_0(r)\tau_x$ is the s-wave pairing.

This Hamiltonian has all the ingredients of the standard 1D model. This gives the possibility of topological phases.

Note: Majorana solutions belong to the $m_J=0$ sector in order to be particle-hole symmetric. These can only be had for n being odd.

Figure 2:
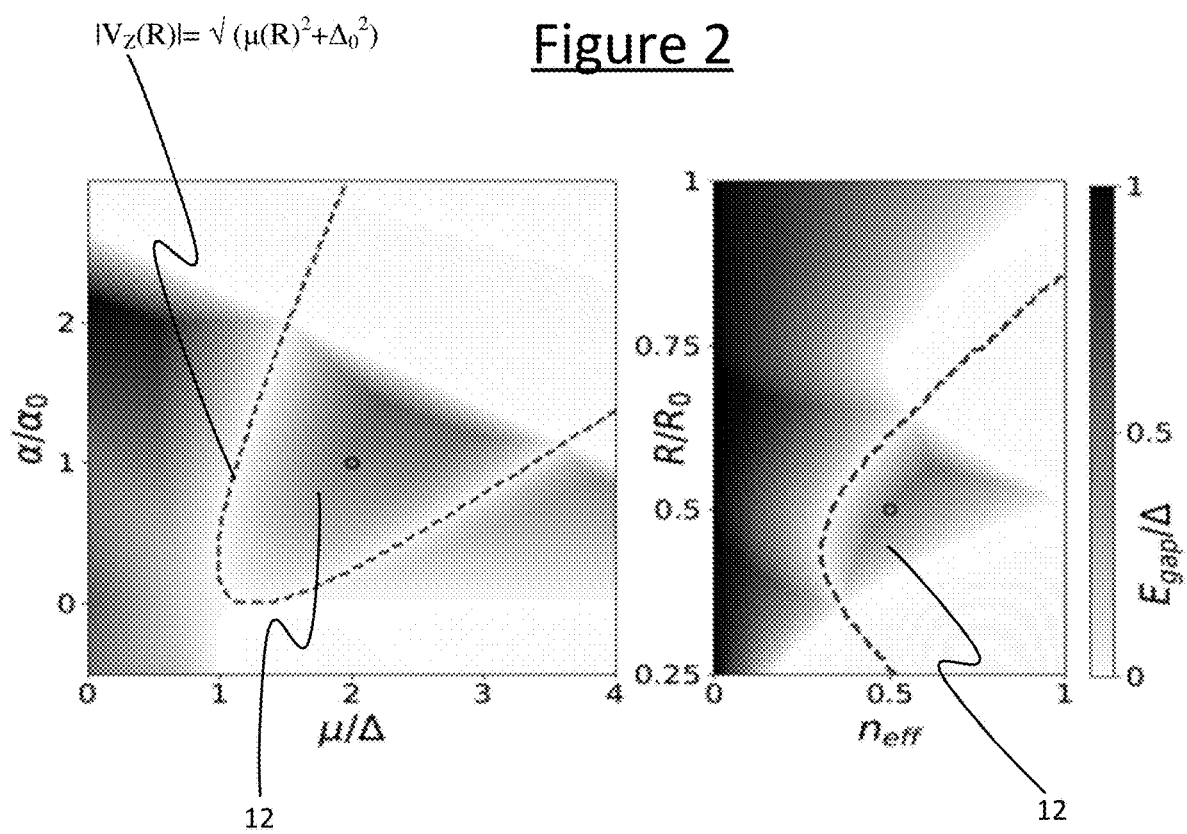
FIG. 2 is a topological phase diagram in a thin shell limit, FIG. 3($a$) is a topological phase diagram for a full core model, FIG. 3($b$) shows band structures at points indicated in FIG. 3($a$), FIG. 4($a$) shows a Majorana coherence length for the full core model, FIG. 4($b$) shows a Majorana wavefunction integrated over radius, FIG. 5($a$) shows an example design for a tetron qubit (also referred to as quad qubit), FIG. 5($b$) shows an example design for a hexon qubit.

FIG. 2 shows a simulated topological phase diagram in the shell limit for the solution for n=1 as the winding number. The left-hand panel shows the bulk energy gap $E_{gap}$ as a function of μ and α (the bulk energy gap being the energy difference between the ground state and the first excited state of a system with no boundary such as an infinitely long wire). The dashed line denotes the boundary of the topological phase in the $m_J=0$ sector, according to the above equations. Here $n_{eff}=\frac{1}{2}$, $R/R_0=\frac{1}{2}$, $\alpha_0=\sqrt{\Delta_0/2m^*}$ and $R_0=1/\sqrt{2m^*\Delta_0}$. For reference, using realistic parameters $m^*=0.026$ me and $\Delta_0=0.2$ meV, one obtains $\alpha_0 \approx 17$ meV·nm and $R_0 \approx 85$ nm. The right-hand panel shows the bulk energy gap at fixed $\mu/\Delta_0=2$ and $\alpha/\alpha_0=1$ and a function of $n_{\text{eff}}$ and R. The circle in the left-hand panel marks the value of $\mu$ and $\alpha$ used in the right-hand panel, and the circle in the right-hand panel marks the values of R and $\phi$ used in the left-hand panel.

The dotted line indicates the topological phase transition, which occurs when $|V_Z(R)|=\sqrt{\mu(R)^2+\Delta_0^2}$. The phase diagram shows that there are stable topological regions, labelled by reference numeral 12 in the diagram.

Consider now the full semiconducting core limit $R_1=0$. The Hamiltonian may again be modelled as follows:

$$H_{BdG} = \left[\frac{p_z^2}{2m^*} + \frac{p_r^2}{2m^*} + \frac{(p_\varphi + eA_\varphi \tau_z)^2}{2m^*} - \mu\right]\tau_z - \alpha_r \sigma_z \tau_z(p_\varphi + eA_\varphi \tau_z) +$$
$$\alpha_r p_z(\sigma_y \cos\varphi - \sigma_x \sin\varphi)\tau_z + \Delta_0(r)[\cos(n\varphi)\tau_x + \sin(n\varphi)\tau_y]$$

where the first term $$\left[\frac{p_z^2}{2m^*} + \frac{p_r^2}{2m^*} + \frac{(p_\varphi + eA_\varphi \tau_z)^2}{2m^*} - \mu\right]\tau_z$$

represents the kinetic energy, the middle two terms $-\alpha_r \sigma_z \tau_z(p_\varphi + eA_\varphi \tau_z) + \alpha_r p_z(\sigma_y \cos\varphi - \sigma_x \sin\varphi)\tau_z$ represent the radial spin-orbit field, and the last term $\Delta_0(r)[\cos(n\varphi)\tau_x + \sin(n\varphi)\tau_y]$ represents the pairing with winding number n.

Figure 3A:
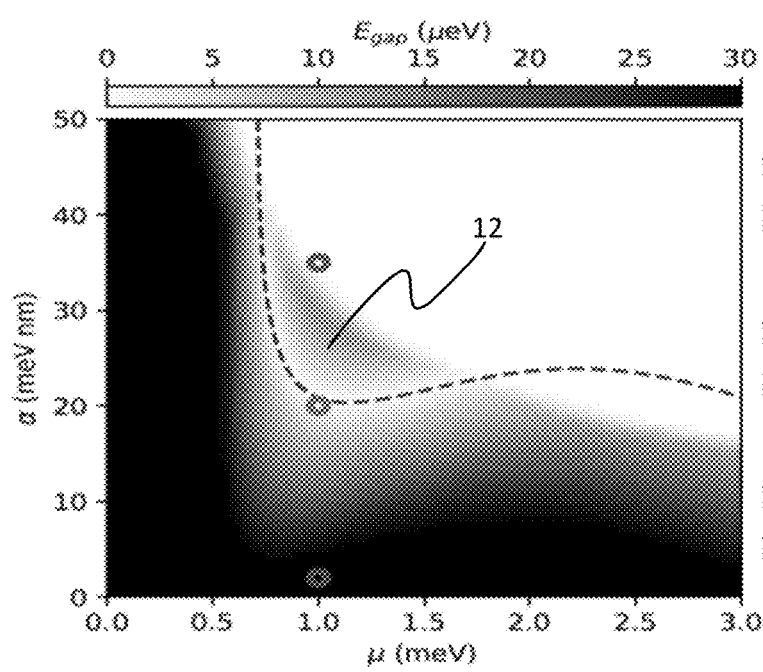
Figure 3B:
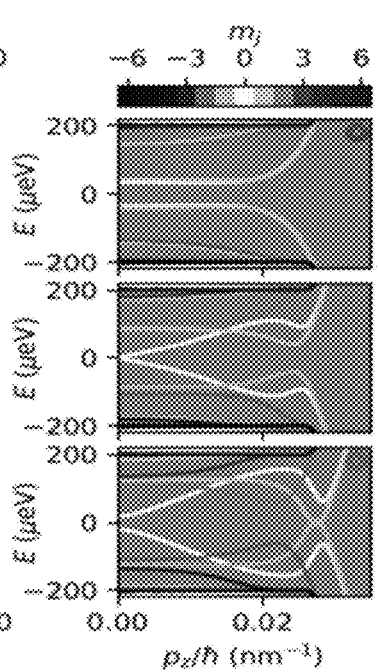

FIG. 3(a) shows the simulated topological phase diagram for the full core model with $R_2=100$ nm, $R_3=3000$ nm, $m^*=0.026$ me and $\Delta_0=0.2$ meV. The bulk energy gap Egap is plotted as a function of $\mu$ and $\alpha$. The dashed line denotes the boundary of the topological phase obtained by finding the zero energy crossing at $p_z=0$ in the $m_J=0$ sector. FIG. 3(b) shows band structures at the points indicated by the circles in FIG. 3(a): the upper circle in FIG. 3(a) corresponds to the lower plot in FIG. 3(b), the middle circle in FIG. 3(a) corresponds to the middle plot in FIG. 3(b), and the lower circle in FIG. 3(a) corresponds to the upper plot in FIG. 3(b). In FIG. 3(b) the shade of the bands indicates which $m_J$ sector they belong to. In each plot in FIG. 3(b), the bands above E=0 correspond to increasing positive values of $m_J$ with increasing darkness, and the bands below E=0 correspond to decreasing negative values (increasing in magnitude) with increasing darkness. The parameters are from top to bottom $\mu=1$ meV and a={2,20,35}meV·nm.

Figure 4A:
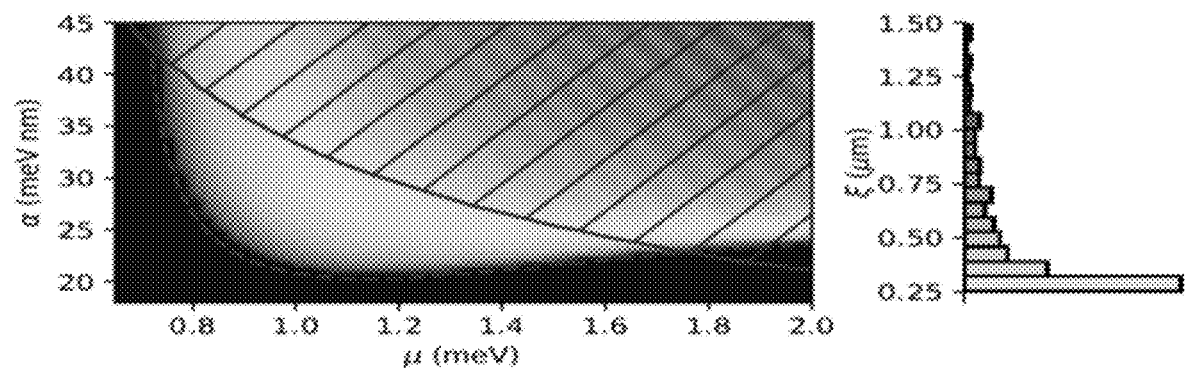
Figure 4B:
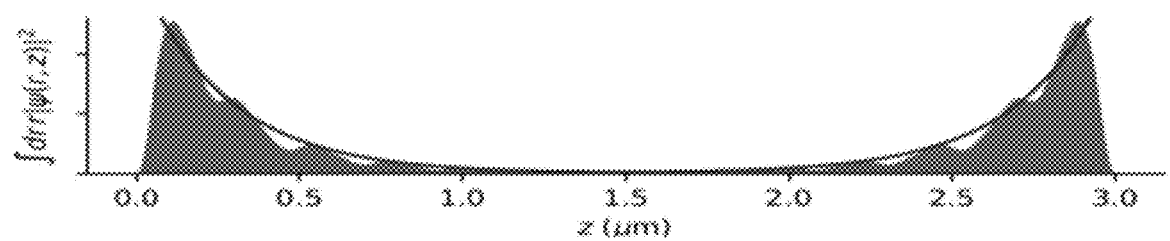

FIG. 4 shows the simulated Majorana splitting energy and coherence length. FIG. 4(a) shows the Majorana coherence length for the full core model with the same parameters as in FIG. 3. The coherence length is obtained by fitting the exponential decay of the Majorana wavefunction in a wire of 3 μm length. The dashed line denotes the boundary of the topological phase in the $m_J=0$ sector and the hatched region is gapless due to higher $m_J$ regions. The histogram indicates the frequency $\zeta$ of coherence lengths in the gapped topological phase. FIG. 4(b) shows the Majorana wavefunction $\psi$ integrated over radios for $\mu=1$ meV and $\alpha=30$ meV·nm. The solid line is obtained by fitting the envelope of the wavefunction with a double exponential in the interval 0.5 μm<z<2.5 μm.

As shown above, full shell nanowires support Majorana zero modes across a wide range of parameters, so one can use these systems for quantum computing purposes.

In conventional nanowires without a full coating of superconductor, the inducement of MZMs is due to the spin effect of the magnetic field B. However, in full-shell nanowires 7, the inducement of MZMs is due to a coupling between the magnetic field B and the winding of the superconducting phase by means of an orbital effect of the magnetic field B. A result of this is that MZMs can be induced with a significantly lower magnitude of magnetic field. Thus this allows a quantum device or computer to work with a lower magnetic field.

The ideas outlined in Karzig et al. (Phys. Rev. B 95, 235305 (2017), "Scalable designs for quasiparticle-poisoning-protected topological quantum computation with Majorana zero modes") also apply in this case. Indeed, by combining Topological (T) and non-topological (e.g. conventional s-wave (S)) segments, one can build a superconducting island with finite charging energy and Majorana-induced ground-state degeneracy. In addition to the planar designs explained in Karzig et al. (2017), full shell nanowires allow for vertical designs. The following illustrates several arrangements incorporating vertical "forests" of topological wires into qubit and computer designs. There then follows a description of example fabrication methods and approaches which can be followed to realized theses designs as devices.

Vertical semiconductor nanowires 7 can be used for multiple quantum computing applications. For example vertical nanowires 7 with full or partial shells can host Majorana zero modes (MZM) which when combined into superconducting islands become qubits (tetron, 4MZMs), hexons (6MZMs), or larger quantum Hilbert spaces.

Vertical nanowires 7 with or without shells can also serve as connectors between different planes (e.g. semiconductor, contact and/or gate planes) and thus provide a valuable tool for scalable 3D integrated solution to layout and space problems in the quantum sector of a quantum computer.

As another example, vertical semiconductor nanowires 7 with either full or partial shells can also serve as conventional qubits, e.g. Gatemons, and in that capacity contribute to a solution to the 3D integration problem.

Figure 5A:
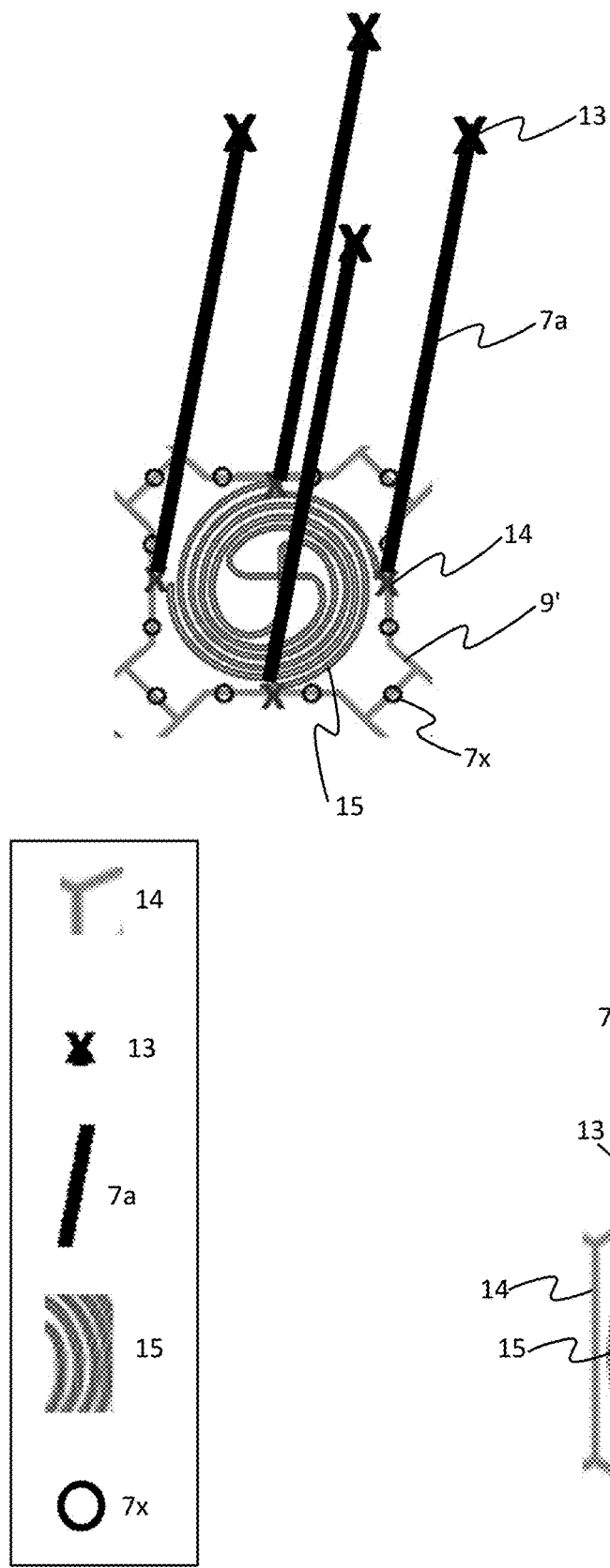
Figure 5B:
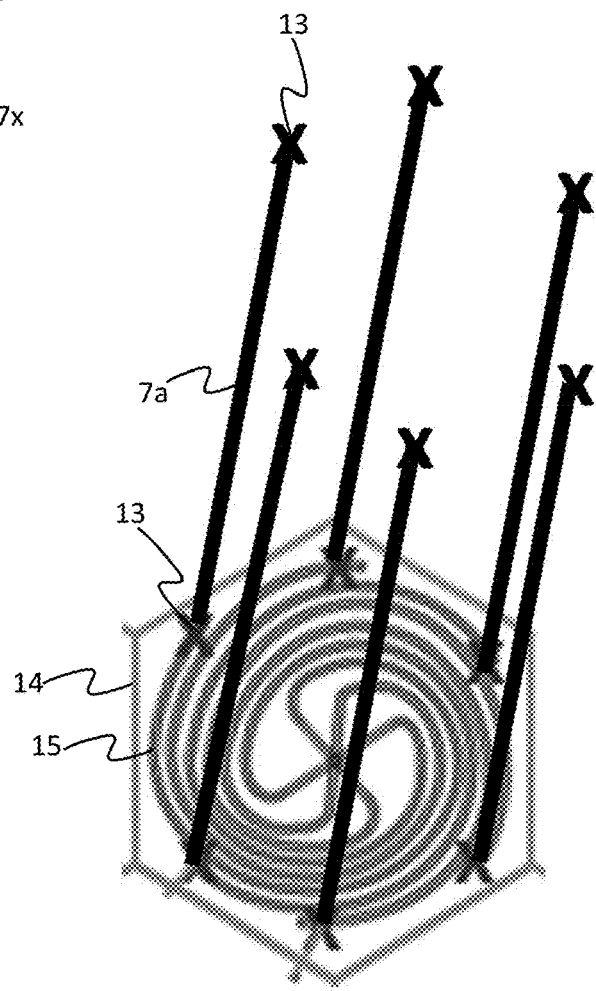

FIG. 5(a) illustrates an example design for a tetron qubit. FIG. 5(b) illustrates an example design for a hexon, which is a qubit plus an ancilla qubit. The designs employ a vertical geometry. In either case, each tetron or hexon comprises a portion of a semiconductor network 14, which may be formed in the plane of the substrate 5. The semiconducting network 14 may be formed partially or wholly from the same semiconducting material as the nanowire cores 9, e.g. InAs or InSb. Each tetron or hexon also comprises a superconducting island 15, which may also be formed in the plane of the substrate 5. The superconducting island may be formed partially or wholly from the same superconductor material as used to form the nanowire coatings 10, e.g. Al or Nb. Each tetron or hexon further comprises a plurality of vertical nanowires 7a arranged to be invoked into the topological phase (the active nanowires), formed perpendicular to the plane of the substrate 5. Each tetron or hexon may also optionally comprise one of more full shell nanowires 7x disconnected from the semiconductor network 14 but connected to a voltage source and acting as electric gates.

The tetron comprises four vertical active nanowires 7a. The hexon comprises six active topological nanowires 7a. In either case, each nanowire has one end connected to the superconducting island 15. In embodiments, the island 15 comprises a plurality of "arms" of superconductor material, the arms being connected to one another at a common point (e.g. the centre of the island 15) but otherwise separated from one another. For example in embodiments the arms may take the form of concentric spiral arms. Each active nanowire 7a is connected at its lower end (the end closest to the substrate 5) to the distal end of a different respective one of the arms of the superconductor island 15, e.g. an end of a respective one of the spiral arms. The semiconductor network 14 connects with the superconductor island 15 at one or more points, for instance at one or more of the points where the active nanowires 7a meet the superconductor island 15 (e.g. two, more or all such points). In embodiments this is at the distal ends of one, two, more or all of the superconductor arms.

By means of such arrangements or similar, then under conditions of a magnetic field component B perpendicular to the active nanowires 7a, a pair of MZMs 13 can be invoked in each such topological nanowire 7a, one at each end.

The arrangement of the superconducting island 15 into thin arms (e.g. spiral arms) is useful (but not essential) as it helps prevent the formation of vortices due to quasiparticle poisoning, i.e. circulating currents which may drive the superconductor 15 into the normal phase and thus hinder the formation of MZMs.

Figure 6:
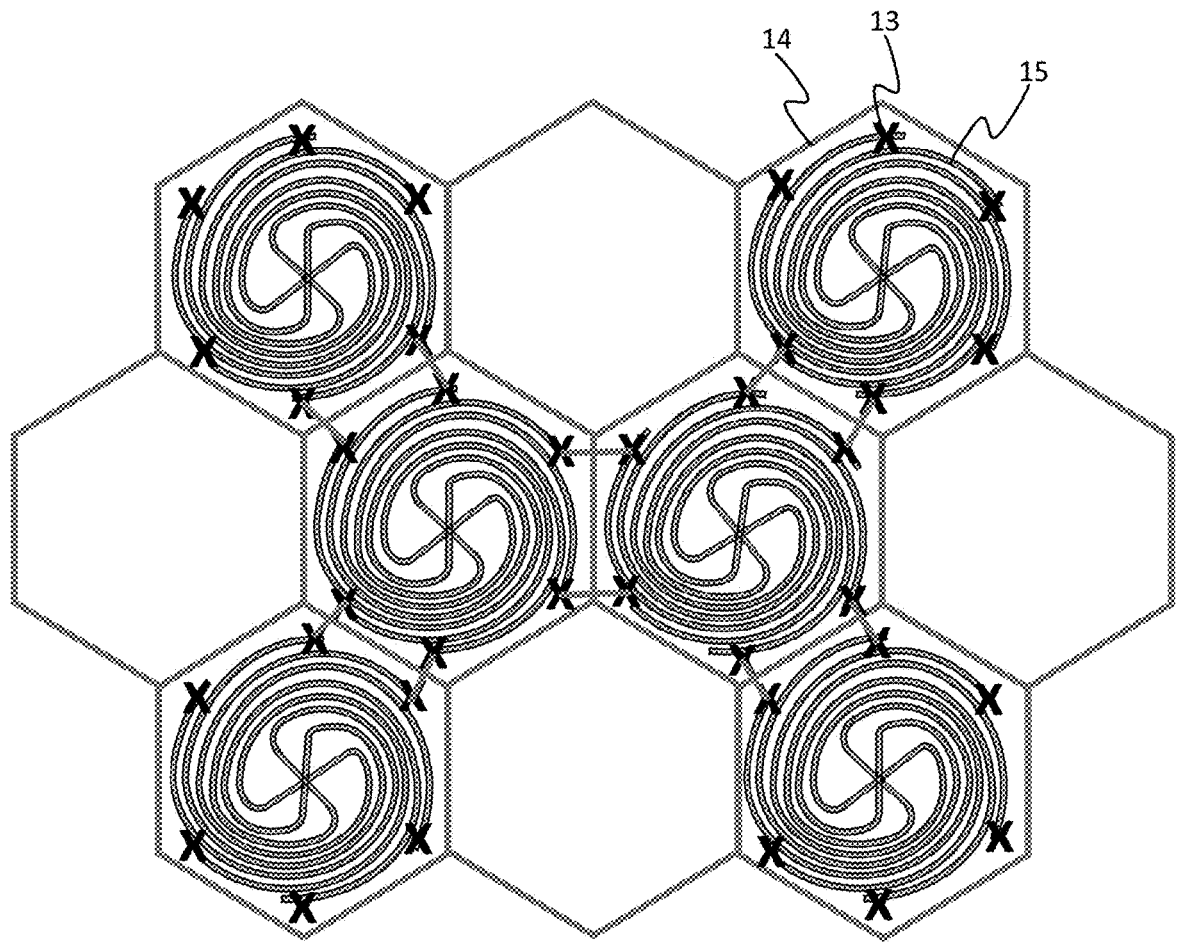
FIG. 6 shows an example design for a network of hexon qubits.
Figure 7:
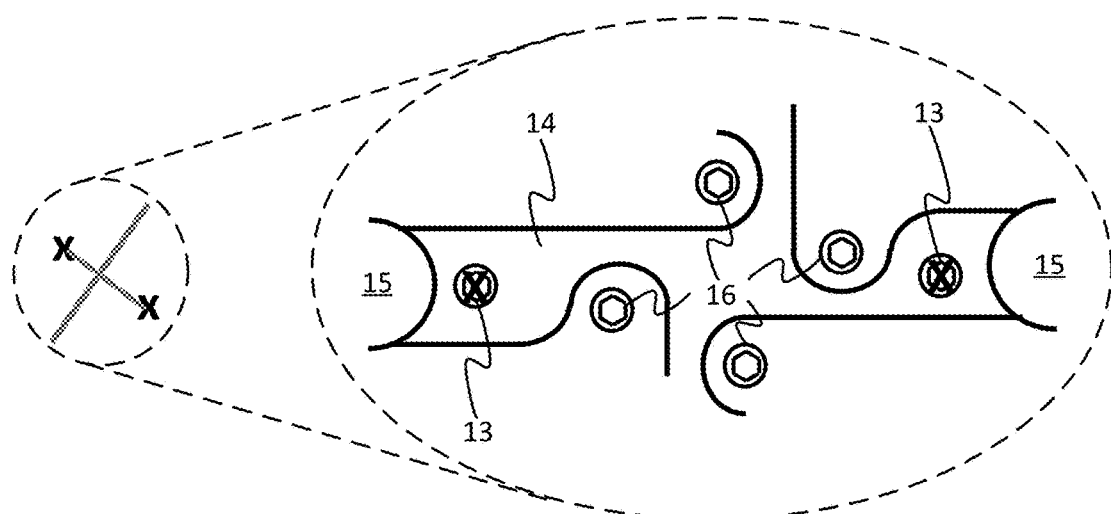
FIG. 7 shows a detail of FIG. 6.

FIG. 6 illustrates a top view of an example wafer in the case of a quantum device comprising a network of hexons. The superconductor (e.g. Al) islands 15 link six MZMs 13 on the wafer to form an "insect" (with six legs—in other words the six MZMs are connected by a central body). An additional six MZMs 13 lie vertically above at the top end of the full shell wires 7a. The latter are uncoupled. The spiral minimizes MZM hybridization, maximizes charging energy $E_c$ in the limit of a dense spiral, and allows the superconductor material 15 to be vortex free in a weak vertical B field. Vertically above each X in the diagram is a topological full shell nanowire 7a. FIG. 7 shows further detail of an example of how other full shell wires 7x may be used as electric gates 16 to open or close tunnel junctions. The full shells 10 meet the superconductor spirals 15 of the superconductor islands. The detail shows where the superconductor network 14 joins adjacent hexons and where, in each hexon, the semiconductor network 14 meets one of the active vertical nanowires 7a (where the MZMs 13 occur). The gates 16 are formed from ones of the non-topological regime nanowires 7x.

Note: with B vertical and weak, many constraints on "comb design" relax, allowing hexagonal symmetry. Note also: due to the crystal lattice structure of the superconductor e.g. aluminium), the spiral form of the superconductor islands 15 may not necessarily be continuously curved, but rather a series of straight edges. The term "spiral" herein does not necessarily imply a perfectly continuous curve.

Figure 8:
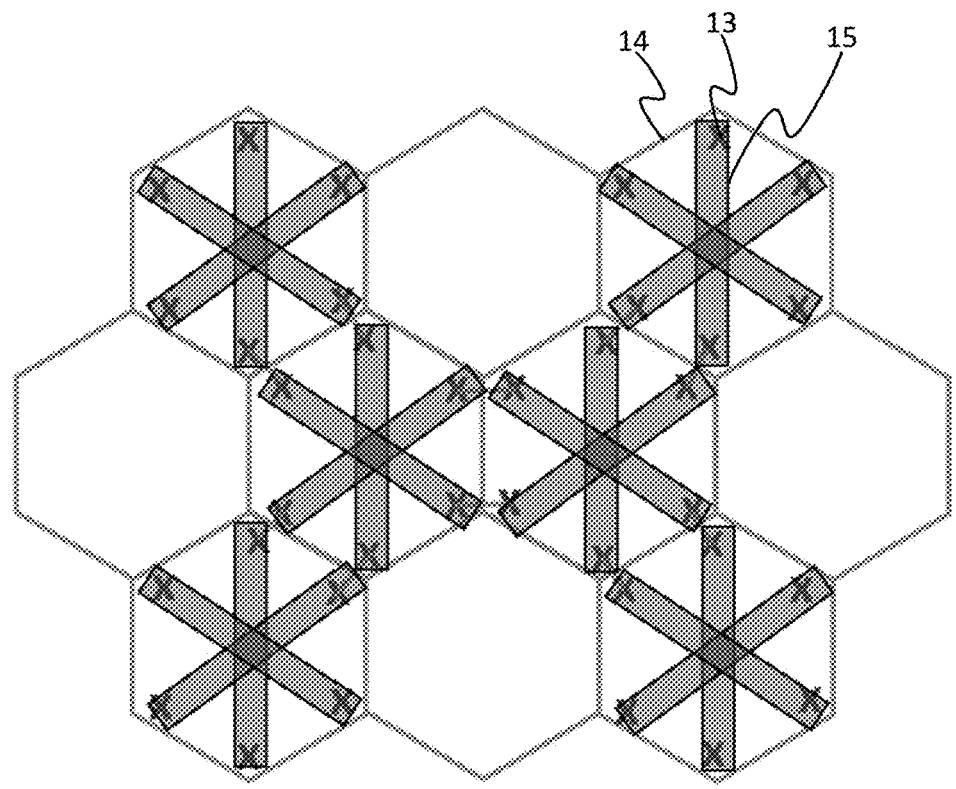
FIG. 8 shows another example design for a network of hexon qubits.
Figure 9:
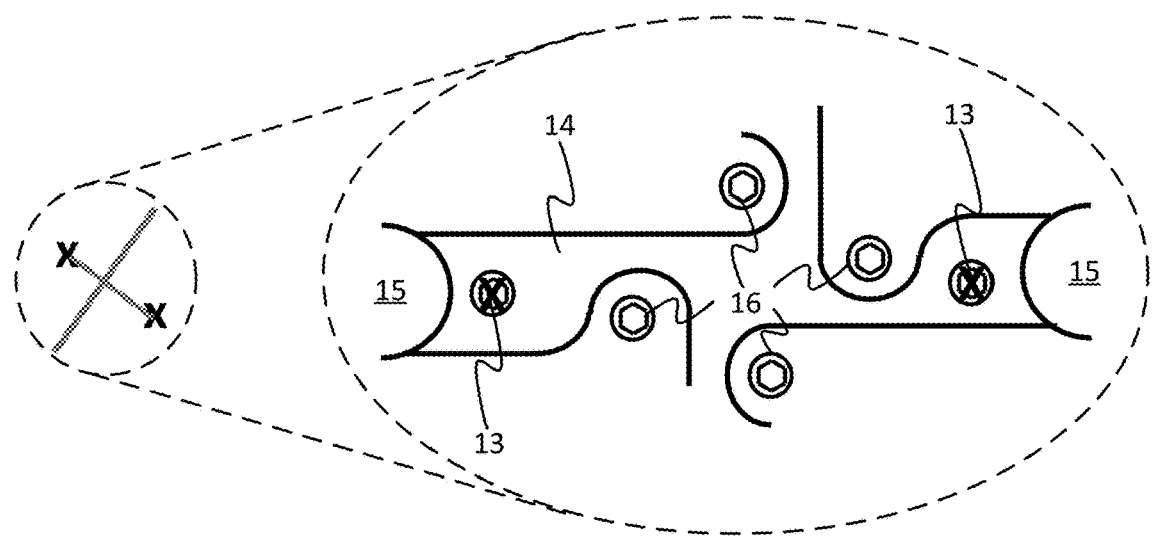
FIG. 9 shows a detail of FIG. 8.

FIG. 8 shows a top view of the wafer in another example design for a quantum device comprising a network of hexons. Here the arms of the superconductor islands 15 do not take the form of spirals, but rather radial arms, but otherwise the design is the same as described in relation to FIG. 6. The radial arms functions similarly to the spirals in that they minimize MZM hybridization, maximize charging energy $E_c$ and allow the superconductor 15 to be vortex free in a weak vertical B field. FIG. 9 shows further detail of an example of how other full shell wires 7x may be used as electric gates 16 to open or close tunnel junctions. The full shells 10 meet the radial superconductor arms of the superconductor islands 15. Again, with B vertical and weak many constraints on "comb design" relax, allowing hexagonal symmetry.

Figure 10:
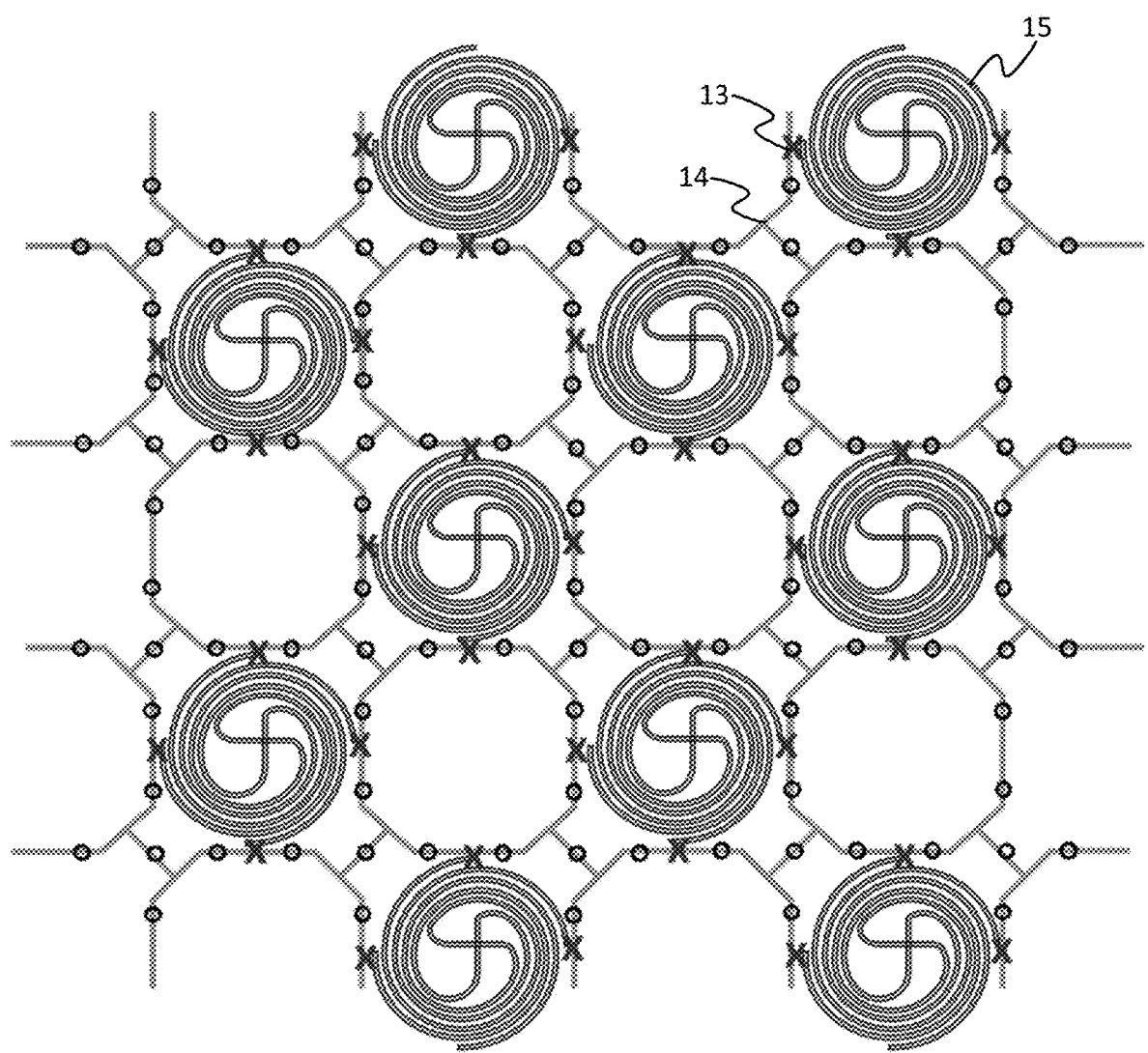
FIG. 10 shows an example design for a network of tetron qubits.

FIG. 10 shows a top-down view of a square layout of tetrons, similar to the hexon arrangement of FIGS. 6 and 7 but with tetrons comprising only four active vertical nanowires per superconductor island 15 instead of six, and the tetrons being linked by square or octagonal cells of the semiconductor 14 rather than a hexagonal comb. Each superconductor island (e.g. Al) 15 supports four plus four MZMs (one at each end of each active vertical nanowire 7a). The tunnel junction in the semiconductor network 14 may be gate controlled by further vertical full shell nanowires 7x as shown in the detail of FIGS. 7 and 9. An advantage of the design of FIG. 10 is slightly smaller superconductor islands 15, and a higher charging energy $E_c$.

Figure 11:
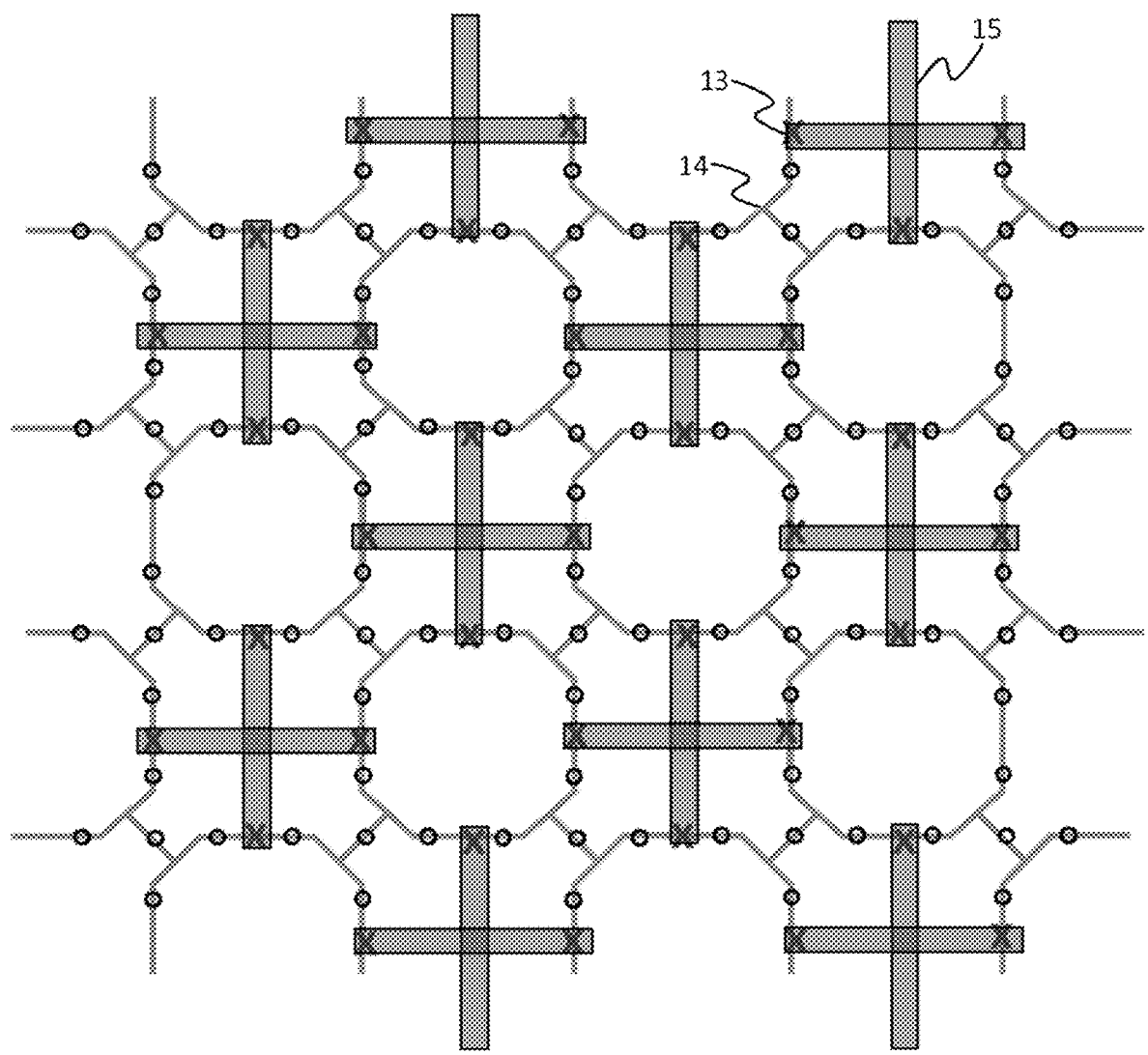
FIG. 11 shows another example design for a network of tetron qubits.

FIG. 11 shows another top-down view of a square layout of tetrons, similar to the tetron arrangement of FIG. 10, but with radial instead of spiral arms 15 as in FIG. 8. Again the tunnel junction in the semiconductor network 14 may be gate controlled by further vertical full shell nanowires 7x as shown in the detail of FIGS. 7 and 9. Again an advantage of the design of FIG. 10 is slightly smaller superconductor islands 15, and a higher charging energy $E_c$.

Figure 12:
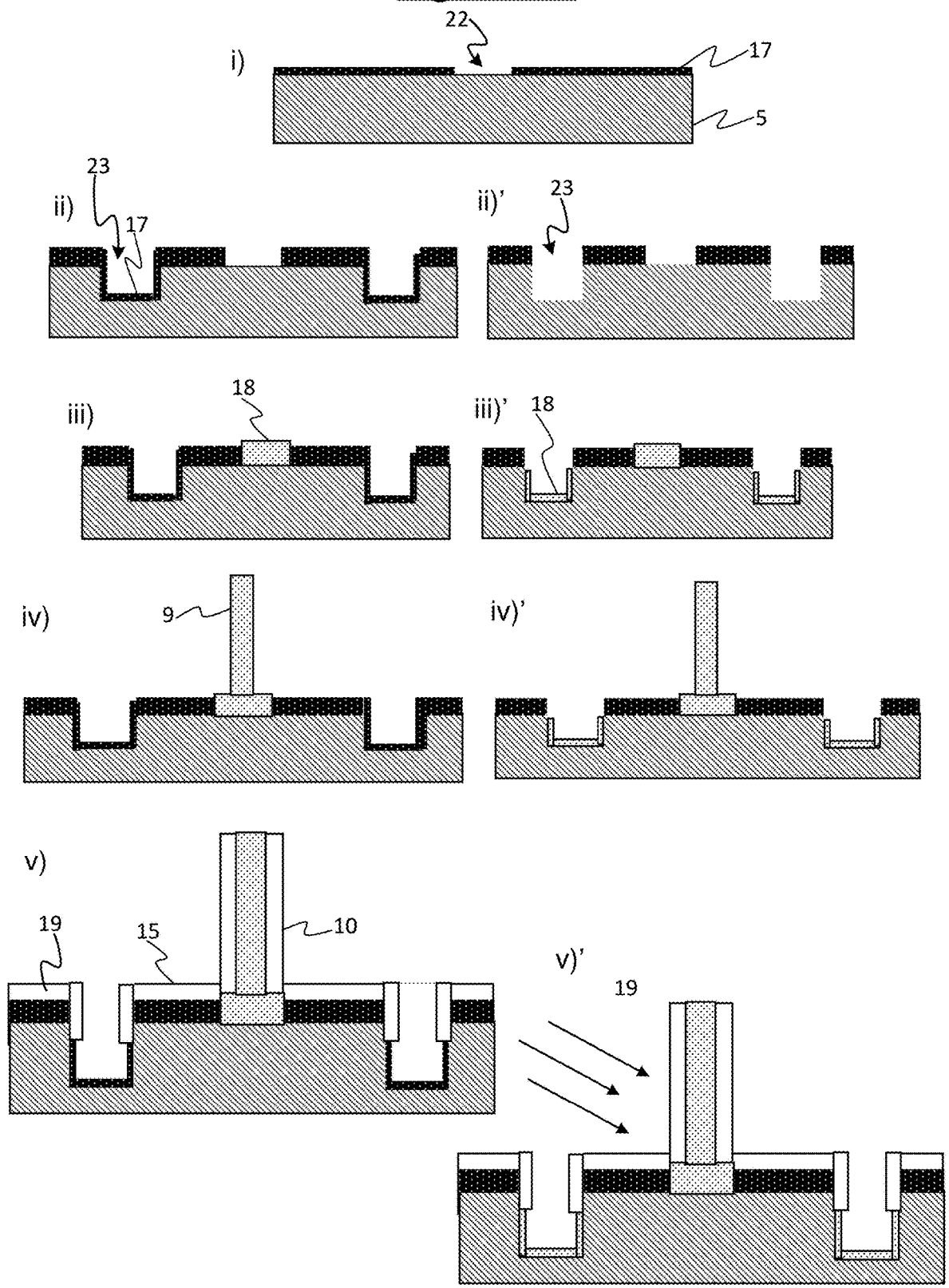
FIG. 12 shows an example fabrication process for fabricating vertical nanowires.

FIG. 12 illustrates some example fabrication steps that may be used to form devices having the structures disclosed herein, such as those of FIGS. 1 to 1B or 5 to 11. FIG. 12 includes fabrication steps to produce selective area grown (SAG) or vapour-liquid-solid (VLS) superconductor on ridges or cliffs for the disclosed designs.

Step i) begins with a substrate 5 and a dielectric layer 17 formed over the substrate 5, with etched windows 22 formed through the dielectric 17 for selective area growth (SAG). These windows 22 are placed where the vertical nanowires 7 are to be grown (one window 22 for each such nanowire 7). The dielectric 17 may be any suitable dielectric insulator. The etching of the windows may be performed using any suitable known etching process.

The method proceeds from step i) to step ii) or ii'). Either way, in this next step the substrate 5 is etched with trenches 23. Any suitable known etching process may be used. In variant ii) a further layer of dielectric 17 is applied which covers the inside surfaces of the trenches 23. In variant ii)' a further layer of dielectric 17 may be applied, but if so then it does not cover the trenches 23. Any suitable selective deposition technique may be used to apply the further layer of dielectric, e.g. using a mask. The dielectric material 17 applied in step ii) or ii') may be the same as applied in step i).

The method then proceeds from step ii) to step iii) or from step ii') to step iii'). In either variant, here a portion of semiconductor material 18 is formed in the window 22 that was formed for each vertical nanowire 7 in step i). This semiconductor 18 is deposited using selective area growth (SAG). In variant iii') the semiconductor material 18 may also be deposited in inside surfaces of the trenches 23. The same semiconductor material 18 may be used as that used to fill the windows, and SAG may also be used. The portions of semiconductor 18 in the windows 22 and trenches 23 may be formed in the same SAG step.

The method then proceeds from step iii) to step iv) or from step iii') to step iv'). In either variant this step comprises growing the semiconductor cores 9 of the nanowires 7 from a semiconductor material 18, using VLS to grow the cores 9 of the wires vertically under SAG conditions. The semiconductor material 18 used to form the nanowire cores 9 in this manner may be the same as that used in step iii or iii') respectively, e.g. InSb or InAs.

The method then proceeds from step iv) to step v) or from step iv') to step v'). In either variant this step comprises depositing a superconductor material 19 over the dielectric 17 and the core 9 of the vertical nanowires 7. The superconductor material 19 may for example be Al or Nb. The deposition may be done though angle deposition of the superconductor material 19 with a grazing angle. FIG. 12v') shows a beam flux of superconducting material. The beam flux may also be used in v) but is not shown for simplicity of illustration. In order to get the wire fully covered, the beam or wafer may be rotated (while keeping the grazing angle in order not to fill the trenches). Depending on angle, the superconductor 19 may or may not meet the semiconductor 18 if present in the trenches 23. The superconductor material 19 that forms over the cores 9 of the nanowires 7 forms the coating 10. Either the wafer or the beam may be rotated in order to achieve a full shell 10 around the vertical nanowires 7. Regions of the superconductor material 19 formed in the plane of the substrate 5 may be used to form the superconducting islands 15.

Depending on application it may be desired to grow semiconductor 18 in the trenches 23 (e.g. to make quantum dots protected from superconductor deposition) or to keep the trenches 23 free of semiconductor growth (e.g. to provide better electrical insulation). These are the unprimed (ii-v) and primed (ii'-v') cases respectively.

The semiconductor 18 and superconductor 19 other than that used to form the cores 9 and coating 10 of the vertical nanowires 7, respectively, may be used to form part or all of one of the layers of circuitry 8, such as the bottom layer of circuity 8b. As mentioned, this could include the superconducting islands 15, quantum dots in semiconductor 18, other parts of the semiconductor network 14, gates 16, contacts for gating, and/or other contacts (e.g. external contacts). Alternatively or additionally, part of all of some or all of these components, and/or other components, may be formed in one or more subsequent steps in one or more other layers 6 formed over the substrate 5.

Figure 13:
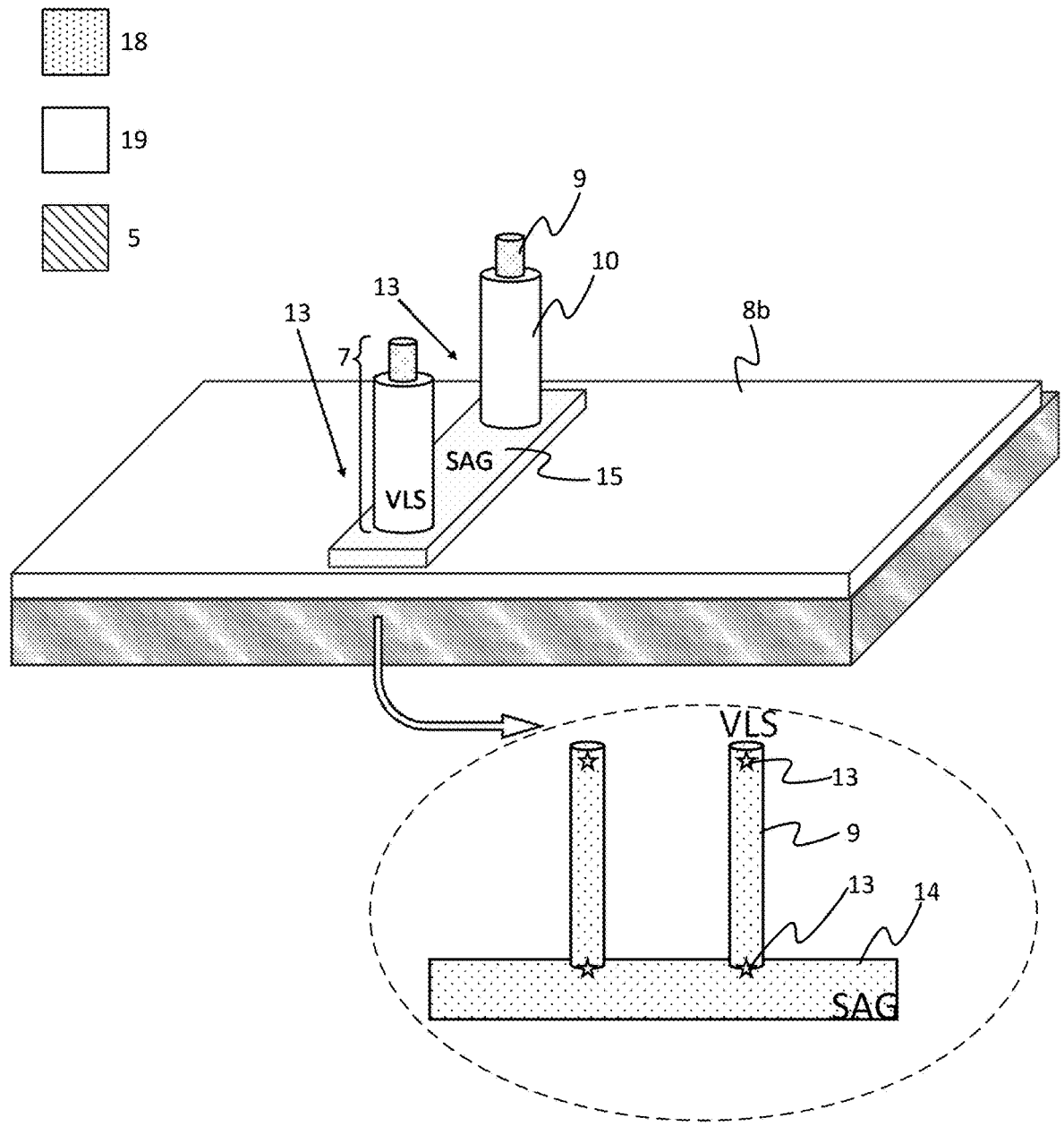
FIG. 13 shows an example design for bottom layer control of a vertical nanowire device, FIG. 14($a$) shows a side view of an example design having horizontal nanowires, FIG. 14($b$) shows a side view of another example design having vertical nanowires, FIG. 14($c$) shows a side view of another example design having vertical nanowires.

FIG. 13 illustrates an isometric view of one example design for all bottom layer control. Here, any arbitrary pattern can be etched in the superconductor 19 in the SAG bottom plane. The dotted circle shows a side view of the semiconductor layer 18 between the substrate 5 and the superconductor layer 19. The nanowire cores 9 may be formed using VLS. The other regions of the semiconductor 18 in the plane of the substrate 5 may be formed using SAG. The dielectric layer 17 is not shown in FIG. 13 but it will be understood that it may be present in embodiments.

Figure 14A:
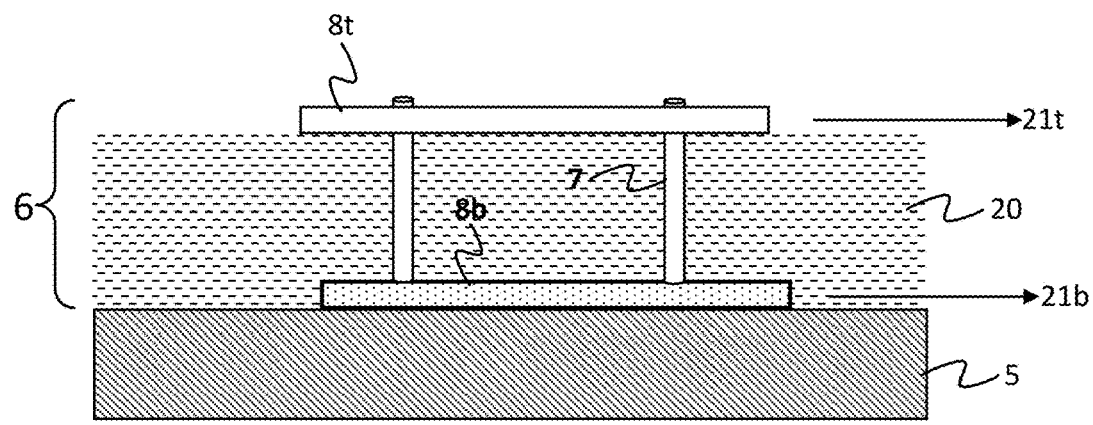
Figure 14B:
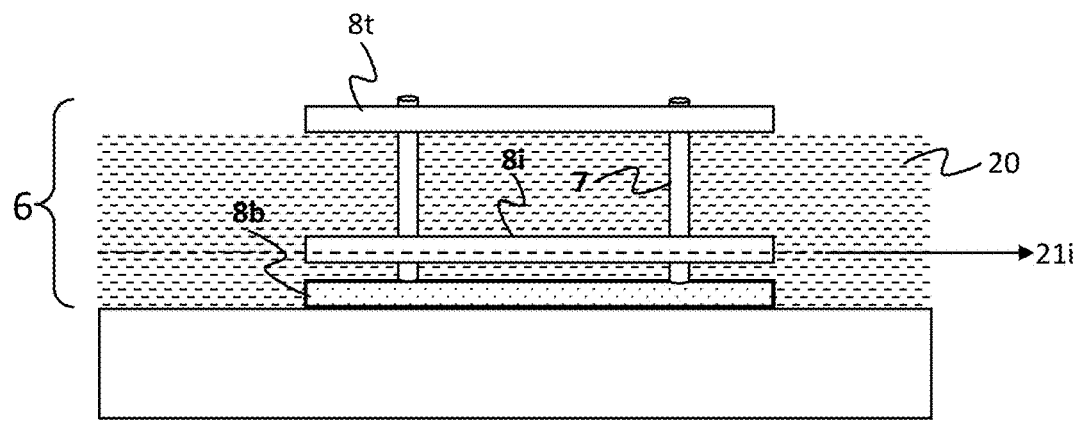
Figure 14C:
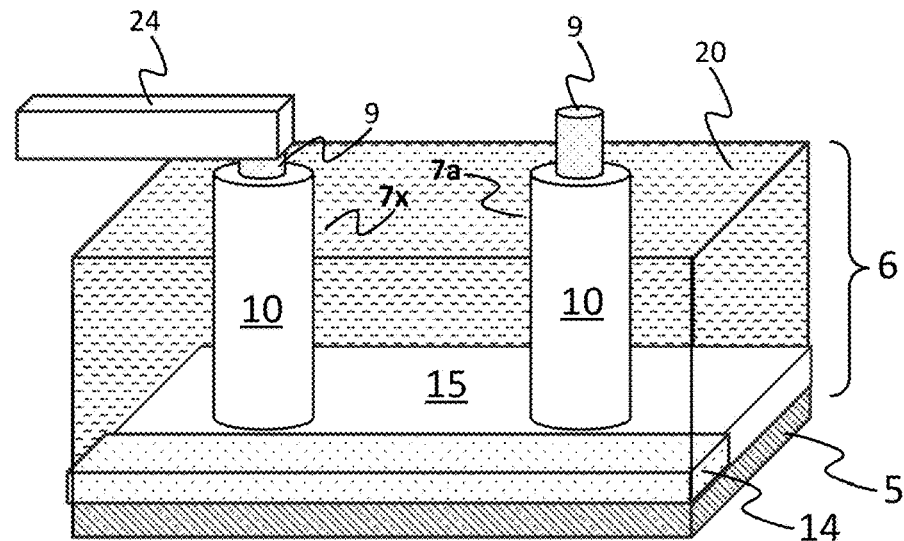

FIG. 14 illustrates some further design features that may be employed in embodiments. FIG. 14(a) shows a side view of the wafer, in which a filler material 20 has been deposited over the semiconductor layer 18, superconductor layer 19 and any other parts of the bottom layer of circuitry 8b. The filler material 20 may for example be a wax, or a plastic such as PMMA. It serves to mechanically support the vertical nanowires 7 in the final, finished device 2. The bottom layer of circuitry 8b may include one or more parts (e.g. semiconductor) suitable for making one or more external contacts 21b with the external equipment (not shown). A top layer of circuitry 8t may be formed over the filler material 20. The top layer of circuitry 18t may include one or more parts (e.g. superconductor 19) suitable for making one or more external contacts 21t with the external equipment. FIG. 14(b) shows a similar arrangement that alternatively or additionally includes at least one intermediate layer of circuitry 8i, beneath and over which the filler 20 is formed. The intermediate layer of circuitry 8i may include one or more parts (e.g. superconductor 19) for making one or more external contacts 21i with the external equipment. The external contacts 21 formed from the bottom, intermediate and/or top layers of circuitry 8 may for example be used to control the qubits (such as for gating), and/or to take measurements, and/or supply power to power the device 2. For instance in embodiments the intermediate layer of circuitry 8i may comprise a gating plane. FIG. 14(c) shows an isometric view of another example, in this case where a contact 24 of a gate 16 is formed in the top layer of circuitry 8t over the filler 20. This contact 24 can be used to apply a potential controlled by the external equipment for gating purposes. Alternatively the gate contact 24 could be formed amongst the filler 20 in an intermediate layer 8i or bottom layer 8b of circuitry 8.

Further Discussion

As described above, the present disclosure describes a new model system supporting Majorana zero modes based on semiconductor nanowires with a full superconducting shell. It is shown that, in the presence of a radial spin-orbit field, the winding of the superconducting order parameter is sufficient to drive the system into a topological phase, thus dramatically reducing the magnitude of the required magnetic field. The resulting topological phase persists over a large range of chemical potentials, opening the way to the realization of Majorana zero modes in an experimental system of easy fabrication and reproducible material quality.

Majorana zero modes (MZMs) hold the promise to revolutionize quantum computation through topological quantum information processing. In the last decade, research in MZMs evolved into one of the most active fields in modern condensed matter physics, with astonishing progress in their experimental realization and theoretical understanding. Much of this activity was fueled by proposals of simple, experimentally viable systems. A particularly promising route involves proximitized semiconducting nanowires (e.g. see Lutchyn et al, "Majorana Fermions and a Topological Phase Transition in Semiconductor-Superconductor Heterostructures", Physical Review Letters 105, 077001 (2010), 13 Aug. 2010)). The essential ingredients in these schemes are quite simple: spin-orbit coupling, a Zeeman field, and induced superconductivity. Nevertheless, the required coexistence of large (~1T) magnetic fields with superconductivity, as well as the need for careful control of the chemical potential in the semiconductor, pose important challenges towards a consistent realization of MZMs in nanofabricated devices, requiring ongoing experimental improvements.

In the present disclosure, there are described semiconducting nanowires fully covered by a superconducting shell as an alternative structure to realize MZMs. While being of similar simplicity and practical feasibility as the original nanowire proposals (e.g. of Lutchyn et al), full-shell nanowires can be used to provide any one or more of a number of key advantages. First and foremost, the topological transition in a full shell wire is driven by the field-induced winding of the superconducting order parameter, rather than by the Zeeman effect, and so the required magnetic fields can be very low (~0.1T). Moreover, the full shell naturally protects the semiconductor from impurities and random surface doping, thus enabling a reproducible way of growing many wires with essentially identical properties. Although full-shell wires do not allow for direct electrostatic gating of the electron density in the semiconducting core, it is demonstrated below that via a careful design of the wire properties, e.g. by choosing the right radius, it is possible to obtain wires that naturally harbor MZMs at certain magnetic field.

While it is known that well-chosen superconducting phase differences or vortices can be used to break time-reversal symmetry and localize MZMs in topological insulators and semiconductor heterostructures, the corresponding realizations typically require careful tuning of the fluxes which would complicate a scalable approach with multiple MZMs (see the above-reference paper by Karzig et al). Here, it is shown that the quantized superconducting winding number in a full-shell wire is a natural and more robust implementation of the wanted phase differences, leading to sizable regions of topological phase space. Below, first these ideas are demonstrated in a simple model of a hollow wire, where an analytic mapping to the standard model of a topological superconductor is possible. These results are then complemented with numerical and analytical studies of the topological phase in the opposite regime where the electron density is spread out over the entire semiconducting core.

Figure 15:
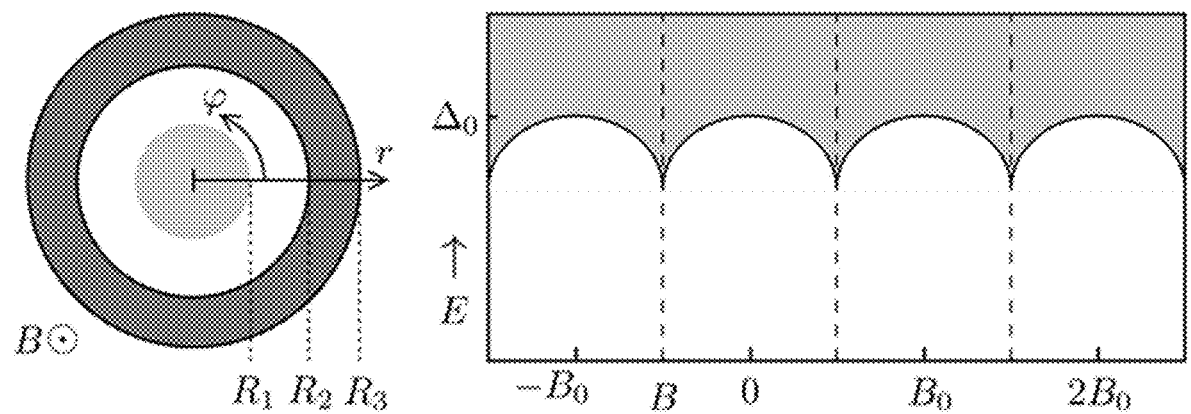
FIG. 15 is a sketch of the energy gap in a superconducting shell as a function of B.

Theoretical model: consider a nanowire consisting of a semiconducting (SM) core and a full superconducting (SC) shell, as illustrated in FIG. 1A. This Illustrates a semiconducting nanowire core 9 with a full superconducting shell 10, subject to a weak axial magnetic field B. Bottom left. In the detail of the cross-section, the region with $r<R_1$ indicates the possible presence of an insulating core 11 in the semiconductor. FIG. 15 is a sketch of the energy gap in the superconducting shell as a function of the magnetic field, exhibiting characteristic Little-Parks lobes. Different lobes correspond to different winding numbers n of the superconducting order parameter around the wire. The period is $B_0 \approx 4\Phi_0/\pi(R_2+R_3)2$ with $\Phi_0=h/2e$ the superconducting flux quantum.

Assume that the semiconductor (e.g. InAs) has a large Rashba spin-orbit coupling due to an intrinsic electric field at the semiconductor-superconductor interface. The system is subject to a magnetic field along the direction of the nanowire $\hat{z}$, i.e. $\vec{B}=B\hat{z}$. Using cylindrical coordinates and the symmetric gauge for the electromagnetic vector potential, $$\vec{A} = \frac{1}{2}(\vec{B}\times\vec{r}),$$

the effective Hamiltonian for the semiconducting core can be written as (here h=1):

$$H_0 = \frac{(\vec{p}+eA_\varphi\hat{\varphi})^2}{2m^*} - \mu + \alpha\hat{r}\cdot[\vec{\sigma}\times(\vec{p}+eA_\varphi\hat{\varphi})] \quad (1)$$

Here $\vec{p}$ is the electron momentum, e>0 the electric charge, m * the effective mass, μ is the chemical potential, α the strength of the radial spin-orbit coupling, and finally σi are spin-½ Pauli matrices. Note that both μ and α may depend on the radial coordinate r. The vector potential $A_\varphi=\Phi(r)/2\pi r$, where $\Phi(r)=\pi Br^2$ is the flux threading the cross-section at radius r. For simplicity, we neglect the Zeeman term due to the small magnetic fields required in these devices.

The shell (e.g. made out of Al) induces superconducting correlations in the nanowire due to Andreev processes at the semiconductor-superconductor (SM-SC) interface. If the coupling to the superconductor is weak, the induced pairing in the nanowire can be expressed as a local potential $\Delta(\vec{r})$, see Appendix B. In the Nambu basis $\Psi=(\psi_\uparrow, \psi_\downarrow, \psi_\downarrow^\dagger, -\psi_\uparrow^\dagger)$, the Bogoliubov-de-Gennes (BdG) Hamiltonian for the proximitized nanowire is then given by:

$$H_{BdG} = \begin{bmatrix} H_0(\vec{A}) & \Delta(\vec{r}) \\ \Delta^*(\vec{r}) & -\sigma_y H_0(-\vec{A})*\sigma_y \end{bmatrix} \quad (2)$$

Assume that the thickness of the SC shell is smaller than London penetration depth: $R_3-R_2 \ll \lambda_L$. Therefore, the magnetic flux threading the SC shell is not quantized. However, the magnetic field induces the winding of the superconducting phase, i.e. the order parameter $\Delta(\vec{r})=\Delta(r)e^{-in\varphi}$ with $\varphi$ the angular coordinate and $n\in\mathbb{Z}$ the winding number. In practice, the winding number n adjusts itself to the value of the external magnetic field so that the free energy of the superconducting shell is minimized. This is the familiar Little-Parks effect: the changes in winding number lead to periodic lobes in the energy spectrum of the superconducting shell, see FIG. 15 and Appendix A.

Notice the following rotational symmetry of the BdG Hamiltonian:

$$[J_z, H_{BdG}] = 0, \text{ with } J_z = -i\partial_\varphi + \frac{1}{2}\sigma_z + \frac{1}{2}n\tau_z, \quad (3)$$

where $\tau_i$ matrices acting in Nambu space are introduced. Eigenstates of $H_{BdG}$ can thus be labeled by a conserved quantum number $m_j$:

$$\Psi_{m_J}(r,\varphi,z) \propto e^{i(m_J-\frac{1}{2}\sigma_z-\frac{1}{2}n\tau_z)\varphi}\psi_{m_J}(r,z). \quad (4)$$

The wave function has to be single-valued, which imposes the following constraint on $m_j$:

$$m_J \in \begin{cases} \mathbb{Z} & \text{for } n \text{ odd,} \\ \mathbb{Z}+\frac{1}{2} & \text{for } n \text{ even.} \end{cases} \quad (5)$$

Now remove the angular dependence of $H_{BdG}$ via a unitary transformation $U=\exp[=i(m_j+\frac{1}{2}\sigma_z+\frac{1}{2}n\tau_z)\varphi]$, namely $\tilde{H}_{BaG}=UH_{BdG}U^\dagger$ where:

$$\tilde{H}_{BdG} = \quad (6)$$
$$\left(\frac{p_z^2}{2m^*}+\frac{p_r^2}{2m^*}-\mu\right)\tau_z + \frac{1}{2m^*r^2}\left(m_J-\frac{1}{2}\sigma_z-\frac{1}{2}n\tau_z+eA_\varphi r\tau_z\right)^2\tau_z - $$
$$\frac{\alpha}{r}\sigma_z\tau_z\left(m_J-\frac{1}{2}\sigma_z-\frac{1}{2}n\tau_z+eA_\varphi r\tau_z\right)+\alpha p_z\sigma_t\tau_z+\Delta(r)\tau_z.$$

Note that naively one would expect spin-orbit coupling to average out. However, the non-trivial structure of $m_j$ eigenvectors yields finite matrix elements proportional to the Rashba spin-orbit coupling.

It will now be shown that the above BdG Hamiltonian supports topological superconductivity and Majorana zero modes. First, notice that particle-hole symmetry relates states with opposite energy and angular quantum number $m_j$, i.e., $\mathcal{P}\Psi_{Em_J}=\Psi_{-E,-m_J}$ with $\mathcal{P}=\tau_y\sigma_y\mathcal{K}$, where $\mathcal{K}$ represents complex conjugation. Thus, a non-degenerate Majorana zero-energy solution can only appear in the $m_j=0$ sector.

In turn, this implies that Majorana zero modes can appear only when the winding number n is odd.

Hollow cylinder model: now focus on the limit in which the semiconductor forms a thin-wall hollow cylinder (i.e., $R_1 \approx R_2$ in FIGS. 1A and 15). This approximation is motivated by the fact that there is an accumulation layer in some semiconductor-superconductor heterostructures such as InAs/Al, so that the electron density is concentrated within the screening length (~20 nm) from the interface. In this case, one can consider only the lowest-energy radial mode in Equation (6). This allows an analytical solution of the model. If one considers the sector $m_j=0$ for n=1, this arrives at the simplified Hamiltonian:

$$\tilde{H}_0 = \left(\frac{p_z^2}{2m^*} - \mu_0\right)\tau_z + V_Z\sigma_z + \alpha p_z \sigma_y \tau_z + \Delta\tau_x \qquad (7)$$

Here, $\Delta \equiv \Delta(R_2)$, and the effective chemical potential and Zeeman energy is defined as:

$$\mu_0 = \mu - \frac{1+[1-\Phi(R_2)/\Phi_0]^2}{8m^* R_2^2} - \frac{\alpha}{2R_2} \qquad (8)$$

$$V_Z = \left[1 - \frac{\Phi(R_2)}{\Phi_0}\right]\left(\frac{1}{4m^* R_2^2} + \frac{\alpha}{2R_2}\right).$$

Notice that when the core is penetrated by one flux quantum, i.e. $\Phi(R_2)=\Phi_0$, $V_Z=0$. This regime corresponds to the trivial (i.e. s-wave) superconducting phase. However, a small deviation of the magnetic field can drive the system into the topological phase (note that magnetic flux piercing the finite-thickness superconducting shell can be significantly different from that penetrating through the semiconducting shell). Indeed, the Zeeman and spin-orbit terms in Equation (7) do not commute and thus $V_Z$ opens a gap in the spectrum at $p_z=0$.

One can map Equation (7) to a Majorana nanowire model (e.g. the model of the above-cited paper by Lutchyn et al) and determine the topological phase diagram by calculating the topological index Q. The topological quantum phase transition between trivial (Q=1) and non-trivial (Q=−1) superconducting phases occurs when:

$$|V_z| = \sqrt{\mu_0^2 + \Delta^2} \qquad (9)$$

Figure 16:
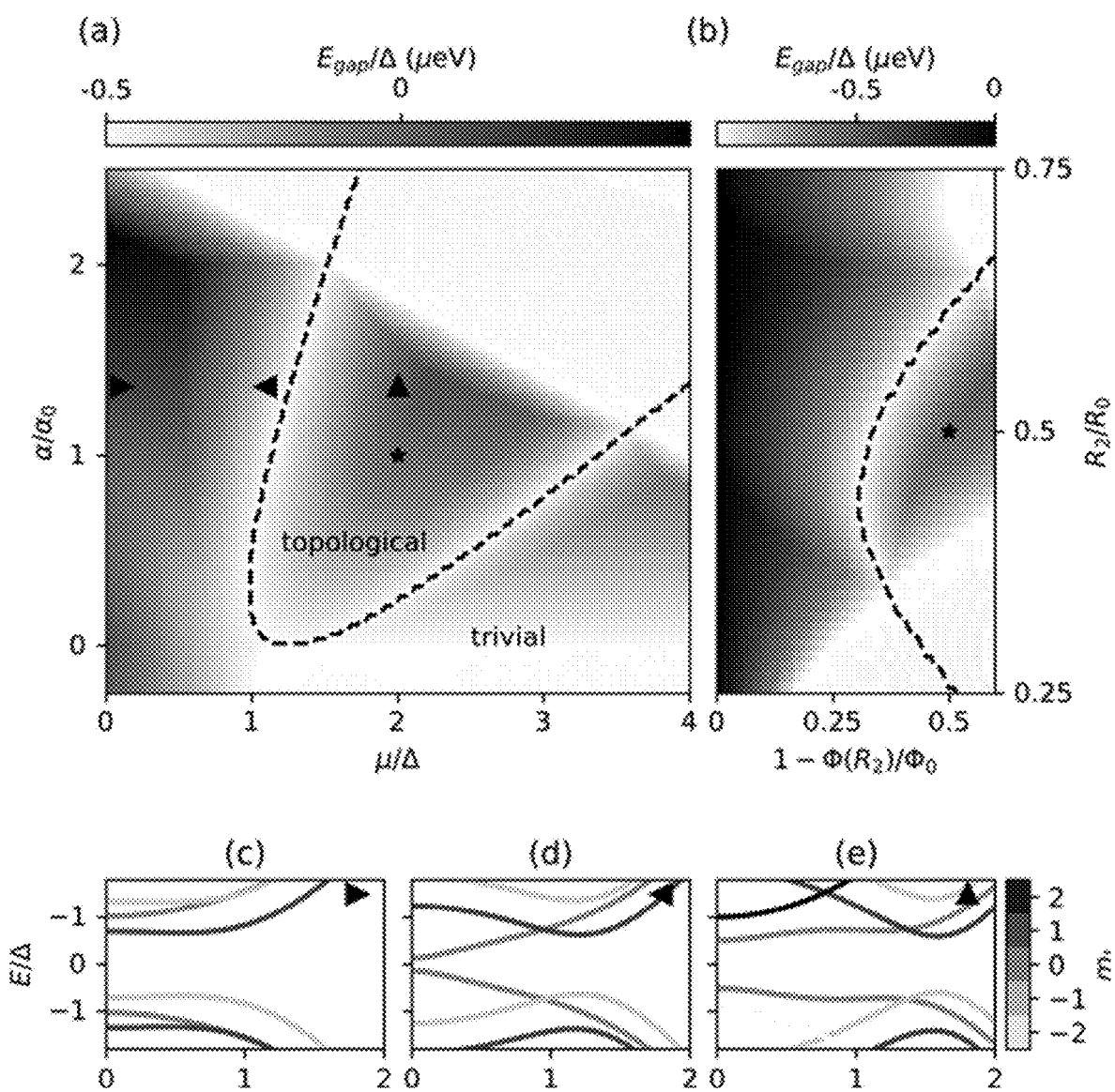
FIG. 16 shows a topological phase diagram of a hollow cylinder model

The resulting phase diagram is shown in FIG. 16, where the gap closing at the topological transition in the $m_j=0$ is indicated by the dashed lines. FIG. 16 shows the topological phase diagram of the hollow cylinder model. Panel (a) shows the bulk energy gap $E_{gap}$ as a function of chemical potential and spin-orbit coupling. The energy gap is multiplied by the topological index $Q=\pm 1$. The dashed line denotes the boundary of the topological phase in the $m_j=0$ sector, as denoted by the written labels and according to Equation (9). Here, $$\frac{\Phi(R_2)}{\Phi_0} = \frac{1}{2}, \frac{R}{R_0} = \frac{1}{2},$$

as indicated by a black star in panel (b). It is defined that $\alpha_0 = \sqrt{\Delta/2m}$ and $R_0=1/\sqrt{2m\Delta}$. For reference, using realistic parameters $m^*=0.026 m_e$ and $\Delta=0.2$ meV, one obtains $\alpha_0 \approx 17$ meV·nm and $R_0 \approx 85$ nm. Right: Bulk energy gap at fixed $\mu/\Delta=2$ and $\alpha/\alpha_0=1$, as indicated by the black star in (a), as a function of flux and R. Panels (c-e) show band-structures at the points indicated in (a) by black triangles, illustrating the closing and re-opening of the bulk gap in the $m_j=0$ sector.

Close to the transition, the quasiparticle spectrum is determined by $m_j=0$ sector and is given by:

$$E(p_z) = \sqrt{V_Z^2 + \Delta^2 + \mu_0^2 + \alpha^2 p_z^2 - 2\sqrt{\alpha^2 p_z^2 \mu_0^2 + V_Z^2(\Delta^2 + \mu_0^2)}} \qquad (10)$$

One can estimate quasiparticle velocity v using Equation 10 to find $v=\alpha\Delta/\sqrt{(\Delta^2+\mu_0^2)}$ and corresponding coherence length $\xi \sim v/E_{gap}$ where $E_{gap}$ is the quasiparticle gap in $m_j=0$ sector.

A well-defined topological phase requires the quasi-particle bulk gap to be finite in all angular momentum channels, and not only for $m_j=0$. Therefore, in FIG. 16 there is shown the energy gap of the model determined by taking into account all $m_j$ sectors. This restricts the extent of the topological phase, since at large chemical potentials and/or spin-orbit couplings the energy gap vanishes in sectors with higher $m_j$ (see Appendix. C). Nevertheless, FIG. 16 demonstrates that in the hollow cylinder model a gapped topological phase exists over a finite range in all the model parameters, with optimal quasiparticle gaps comparable in magnitude to $\Delta$ and the corresponding coherence length $\xi \sim 100$ nm.

Full cylinder model: now consider the case in which the electron density is uniform in the semiconducting core (i.e., $R_1=0$ in FIGS. 1A and 15). One can solve for the radial modes in the core numerically for the different $m_j$ quantum numbers. The superconductor is treated effectively as a boundary condition at $r=R_2$, neglecting the effect of the magnetic field penetrating the shell, so that $\Phi(R_3) \approx \Phi(R_2)$. This treatment of the proximity effect is justified for a thin superconducting shell in the dirty limit (see Appendixes A-D for technical details).

Figure 17:
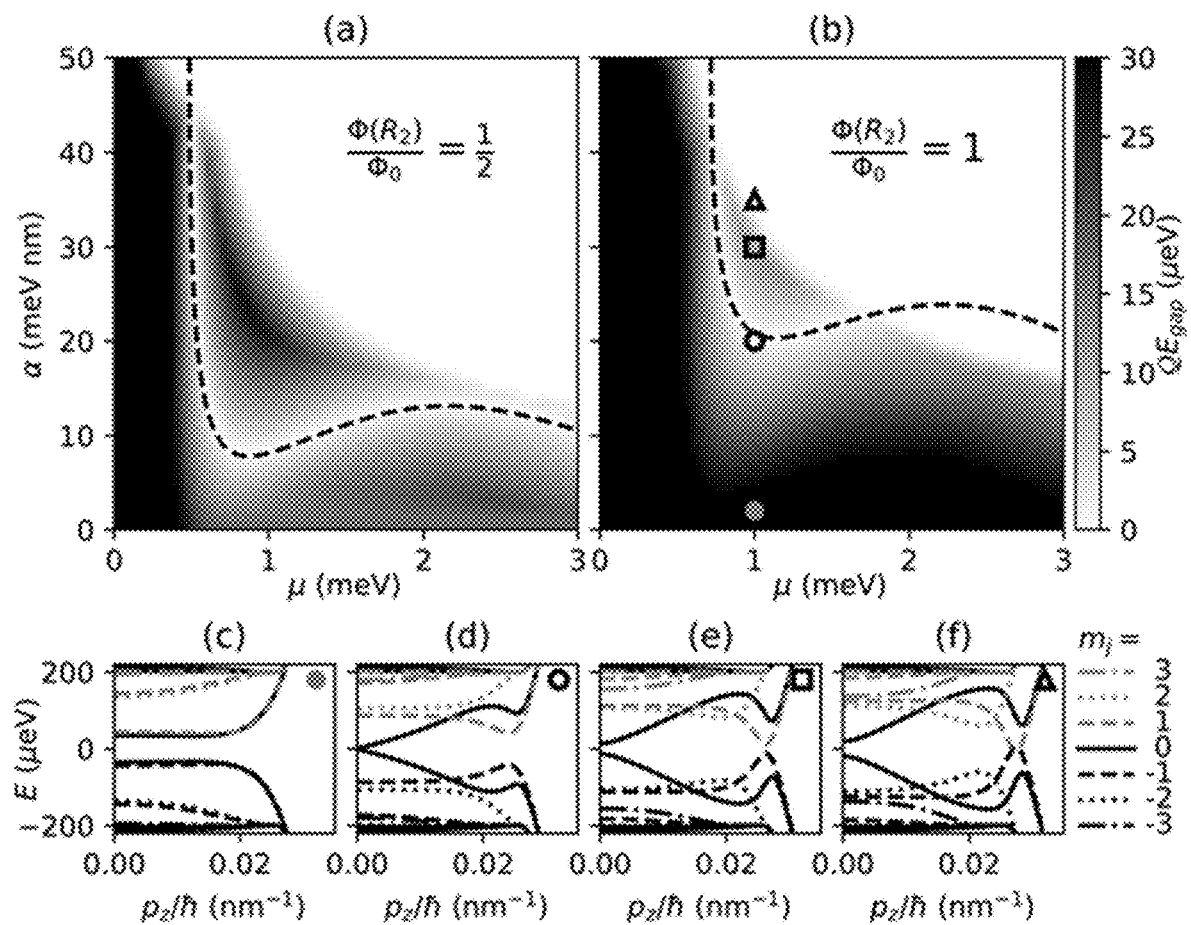
FIG. 17 shows a topological phase diagram for a full cylinder model.

FIG. 17 shows the topological phase diagram for the full cylinder model with parameters appropriate for InAs—Al hybrid semi-superconductor nanowires. Panel (a) shows the topological phase diagram for the full cylinder model with $R_2=100$ nm, $m'''=0.026 m_e$, $\Delta=0.2$ meV, and $\Phi(R_2)=\Phi_0/2$. Panel (b) shows the same but for $\Phi(R_2)=\Phi_0$. The bulk energy gap $E_{gap}$, multiplied by the topological index $Q$ is plotted as a function of $\mu$ and $\alpha$. The dashed line denotes the boundary of the topological phase obtained by finding the zero energy crossing at $p_z=0$ in the $m_j=0$ sector. Panels (c-f) show band structures at the points indicated in (b). The parameters are from left to right $\mu=1$ meV and $\alpha=\{2,20,30,35\}$ meV·nm.

As in the hollow cylinder model, one finds a stable topological phase which extends over reasonably large range of the chemical potential and has the maximum topological gap of order 30 μeV. A large part of the topological phase is gapless due to $m_j \neq 6$ states as in the previous case. Due to the large extend of the radial wavefunction into the semiconducting core the topological gap is smaller in full cylinder model. Also, the cancellation of superconducting winding by the orbital effect is not exact in this case, so that a topological phase also appears at $\Phi(R_2)=\Phi_0$ for appropriate parameters, see also Appendix E. In FIG. 17(*b-e*) there is shown the momentum dispersion of different $m_j$ sectors, illustrating the topological transition in and out of the gapped topological phase. The bands forming in the core of the wire have a distinctly flat dispersion as can be seen in FIG. 17(b), which is reminiscent of Caroli-de Gennes-Matricon vortex states.

The evolution of the local density of states (DOS) at the end of a finite wire as a function of magnetic field is shown in FIG. 18(a). Panel (a) shoes DOS at the end of the wire as a function of flux for $\mu=1.1$ meV, $\alpha=30$ meVnm and the same parameters as in FIG. 17(b) Majorana coherence length for the full cylinder model with the same parameters as in FIG. 178(b) with $\Phi(R_2)=\Phi_0$. The coherence length is obtained by fitting the exponential decay of the Majorana wavefunction in a wire of 3 µm length. The dashed line denotes the boundary of the topological phase in the $m_j=0$ sector and the red shaded region is gapless due to higher $m_j$ sectors. The inset shows the Majorana wavefunction integrated over radius for $\mu=1$ meV and $\alpha=30$ meVnm (this point is also indicated by the black dot). The solid red line is obtained by fitting the envelope of the wavefunction with a double exponential in the interval 0.5 µm<z<2.5 µm. The histogram indicates how often a given coherence length is found inside of the gapped topological phase. Panel (b) shows DOS at the end of the wire as a function of flux for $\mu=1.1$ meV and $\alpha=30$ meVnm.

As the flux $\Phi(R_2)$ is increased, the winding number n changes by one at every half-integer multiple of $\Phi_0$. The change in winding number causes a discontinuous jump in the density of states. At energies comparable to the pairing gap, the DOS reproduces the periodic Little-Parks lobes already sketched in FIG. 15. However, at lower energies, the DOS reveals the different structure of the sub-gap spectrum in the semiconducting core. A peak in the DOS is visible at zero energy in the n=1 and n=3 lobe, but not in the n=0 and n=2 lobes, in agreement with the fact that Majorana zero modes should only appear for odd values of n. Within odd lobes one can see the characteristic asymmetry of the subgap spectra with respect to the center of the lobe which stems from the difference in magnetic flux penetrating the core of the wire and the superconducting shell. The disappearance of the Majorana zero-energy states within odd lobes occurs because both $\mu_0$ and $V_Z$ depend on the magnetic field, see Equations (8) which, at some point, leads to the topological phase transition. The bulk gap closing is clearly visible when plotting the DOS in the middle of the wire, see Appendix F.

In FIG. 18(b), there is investigated Majorana hybridization due to a finite nanowire length (L 3 µm) and extract the coherence length by fitting the Majorana wave function, see the inset. Despite the relatively small topological gaps of FIG. 17, one finds quite short Majorana coherence lengths with the minimum being of the order of 250 nm which is related to the small group velocity of bulk states of FIG. 17(c).

Consider now perturbations breaking the angular symmetry discussed above. Such perturbations (e.g., disorder in the superconducting shell or other imperfections) are ubiquitous in realistic devices and would couple different $m_j$ eigenstates. This may actually have beneficial consequences for the stability of the topological phase since coupling different $m_j$ sectors may induce a gap in the gapless regions occurring at large µ and α in FIG. 17. As a result, such perturbations may lead to a significantly larger topological phase space volume. The inventors have considered effect of the disorder in the superconductor and confirmed this conjecture, see FIG. 19A.

Figure 19A:
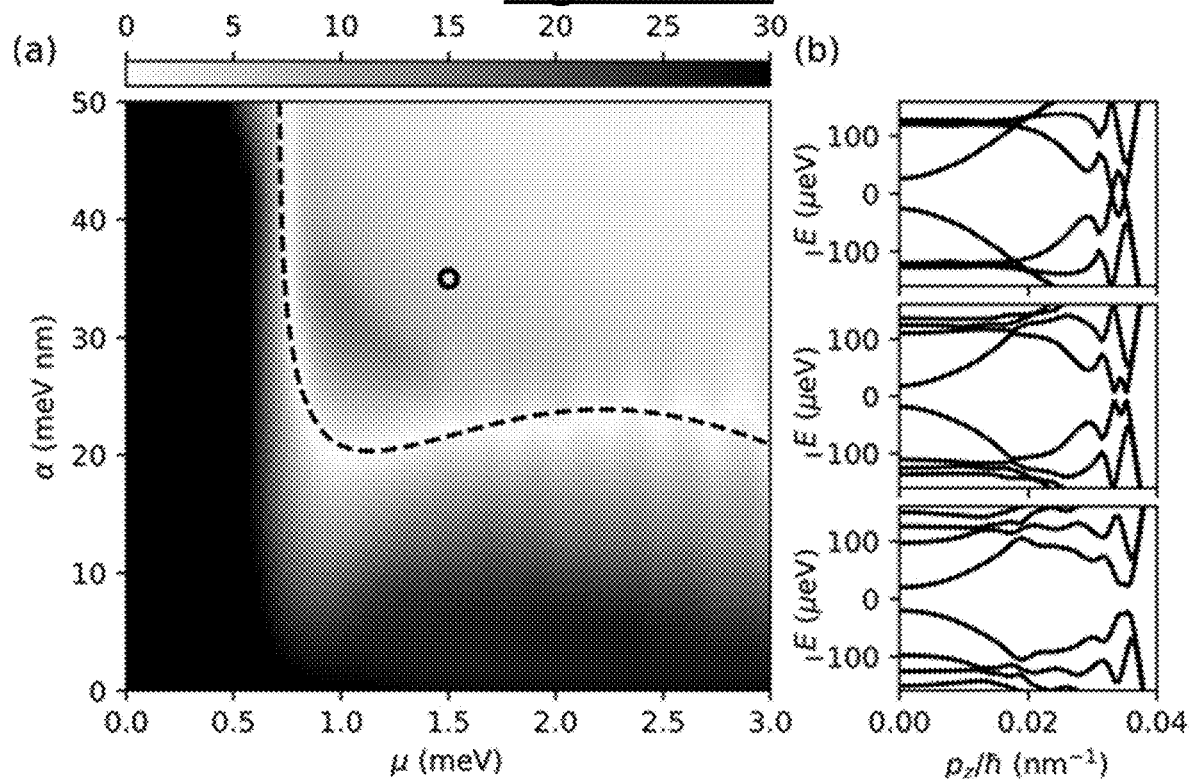
FIG. 19A shows a topological phase diagram for a disordered full cylinder model.

Panel (a) in FIG. 19A shows a topological phase diagram for the disordered full cylinder model with the same parameters as in FIG. 17. To allow for cylindrical symmetry breaking perturbations the Hamiltonian (2) is discretized on a square lattice with a=10 nm in the two dimensional cross section. The disorder potential δU on each lattice site in the superconductor is uniformly distributed $\delta U \in [-U, U]$ with U=2 meV. The gap times the topological index is averaged over twelve disorder configurations. The red dashed line indicates the phase boundary without disorder. Panel (b) shows band structures at $\alpha=35$ eVnm and $\mu=1.5$ meV for increasing disorder strength from top to bottom U={0,2,4} meV. A single disorder configuration is shown.

In fact, the inventors have found that the phase space for the topological phase in full-shell nanowires is very large, supporting MZMs over a wide range of parameters (B field, spin-orbit coupling, chemical potential, radius and temperature). This is demonstrated in FIG. 19B.

Figure 19B:
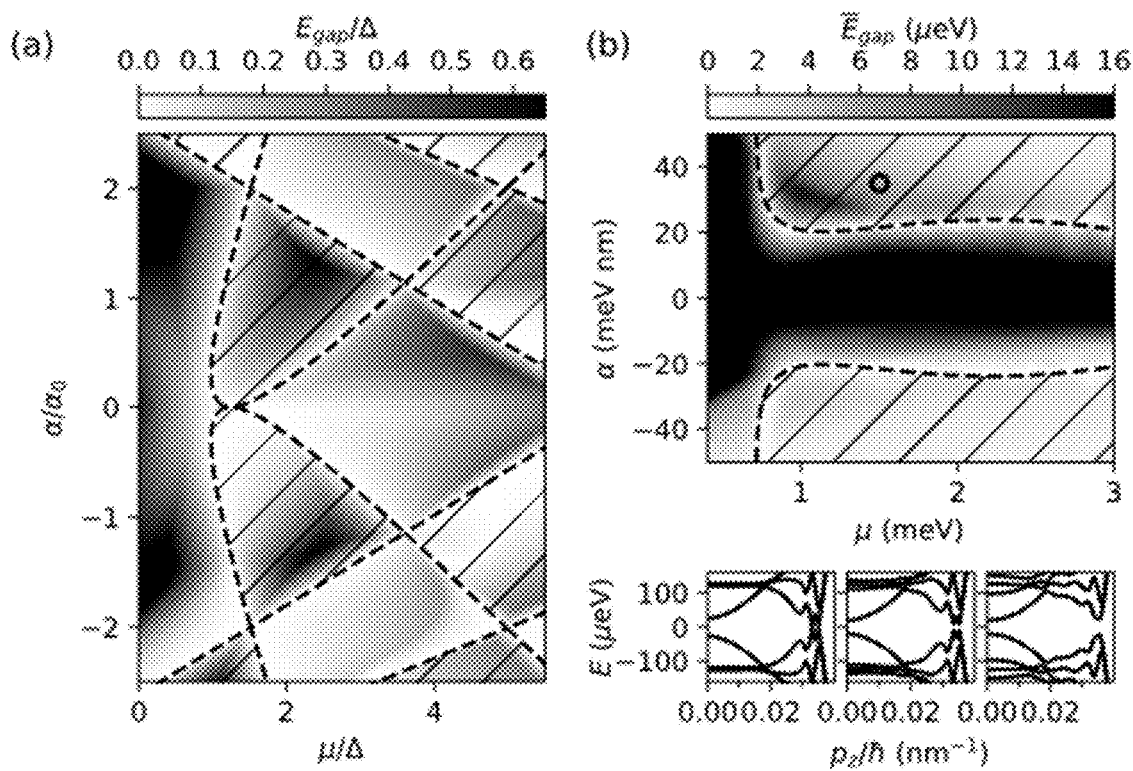
FIG. 19B shows effects of angular-symmetry-breaking perturbations.

FIG. 19B shows the results of an investigation into the effects of angular-symmetry-breaking perturbations on the phase diagram. Such perturbations (e.g., shape deformations or the disorder in the superconducting shell) are ubiquitous in realistic devices and would couple different $m_j$ eigenstates which can have beneficial consequences for the stability of the topological phase. Indeed, the perturbations that couple different $m_j$ sectors may open a gap in the regions of large µ and |α|. Hatched regions are topological. Panel (a) shows the topological phase diagram for the hollow cylinder model with broken angular symmetry. The symmetry is broken by introducing an anisotropic effective mass that is dependent on φ in the z-direction: $1/m_z^* = 1/m^*(1+q \cos(2\varphi))$. Results are shown for q=1, $\Phi(R_2)/\Phi_0=½$ and $R/R_0=½$.

Panel (b) of FIG. 19B shows the topological phase diagram for the disordered full cylinder model with the same parameters as in FIG. 3(a) using $\Phi(R_2)/\Phi_0=1$. To allow for cylindrical symmetry breaking perturbations the Hamiltonian is discretized on a square lattice with a=10 nm in the two-dimensional cross section. The disorder potential ΔU on each lattice site in the superconductor is uniformly distributed $\Delta U \in [-U, U]$ with U=2 meV. The scenario of FIG. 19B considers rotational symmetry breaking disorder that is translationally invariant in the z direction. The gap times the topological index is averaged over twelve realizations. The dashed lines indicate the phase boundaries without disorder. Below are shown the band structures at $\alpha=35$ eV nm and $\mu=1.5$ meV for increasing disorder strength from left to right U={0, 2, 4} meV. A single disorder configuration is shown.

To summarize, the above has investigated a novel physical system supporting Majorana zero modes based on semiconductor nanowires covered by a superconducting shell. Using a combination of analytical and numerical methods, it has been calculated the topological phase diagram and show that the model supports robust topological superconductivity in a reasonably large parameter space. The topological phase can be characterized by calculating quasiparticle gap and effective coherence length. The existence of a readily accessible robust topological phase in full-shell nanowires opens a pathway for realizing topological quantum computing devices.

APPENDIX A: Model for the Disordered Superconducting Shell.

In this section, there is considered a disordered superconducting shell (e.g. Al shell) with inner and outer radii $R_2$ and $R_3$, respectively, see FIGS. 1A and 15. It is assumed that the thickness of the shell $d \equiv R_3-r_2 \ll \lambda_L$, with $\lambda_L$ being the London penetration length in the bulk superconductor. In this case, the screening of the magnetic field by the superconductor is weak and can be neglected. The effective Hamiltonian for the SC shell in cylindrical coordinates can be written as:

$$H_{BdG}^{(s)} = \left[\frac{\hat{p}_z^2}{2m^*} + \frac{\hat{p}_r^2}{2m^*} + \frac{(\hat{p}_\varphi + eA_\varphi \tau_z)^2}{2m^*} - \mu^{(s)} + V_{imp}\right]\tau_z + \qquad (A1)$$

$$\Delta_0[\cos(n\varphi)\tau_x + \sin(n\varphi)\tau_y]$$

Here, $\hat{p}_i$ are the electron momentum operators, e>0 the electric charge, m the electron mass in the SC, $$A_\varphi = \frac{1}{2}Br, \mu^{(s)}$$

is the chemical potential in the SC, $\tau_i$ are Pauli matrices representing Nambu space, $\Delta_0$ is bulk SC gap at B=0, n is the winding number for the SC phase, and $V_{imp}$ represents short-range impurity scattering potential. It is enlightening to perform a gauge transformation which results in a real order parameter, i.e. $\Delta_0[\cos(n\phi)\tau_x + \sin(n\phi)\tau_y] \to \Delta_0\tau_x)$. The gauge transformation introduces an effective vector potential, $A_\varphi = \tilde{A}_\varphi$ with:

$$\tilde{A}_\varphi = -\frac{1}{2er}(n - 2eA_\varphi r) = -\frac{1}{2er}\left[n - \frac{\Phi(r)}{\Phi_0}\right] \qquad (A2)$$

where $\Phi(r) = \pi Br2$ and $\Phi 0 = h/2e$. It follows from this argument that the solution of Equation (A1) should be periodic with $\Phi_0$, see FIG. 20. Namely, the winding number adjusts itself to the value of the magnetic field so that the energy of the superconductor is minimized. In particular, for each winding number n, the maxima of the quasiparticle gap occur at:

$$B_n \approx 4n\frac{\Phi_0}{\pi(R_2 + R_3)^2} \qquad (A3)$$

The Zeeman contribution can be neglected since the typical magnetic fields of interest are smaller than 100 mT for which the Zeeman splitting is negligible.

Figure 20:
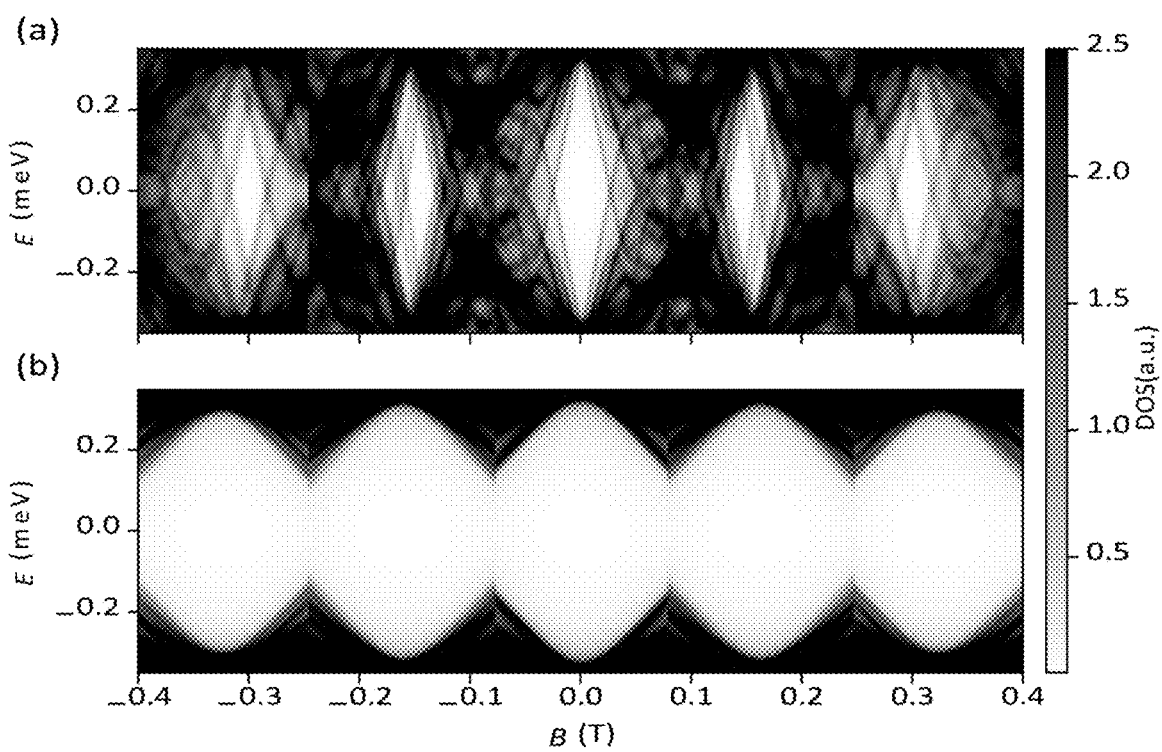
FIG. 20 shows a simulation of a superconducting shell.

FIG. 20 shows a simulation of a superconducting shell, without the semiconducting core, with $R_1 = R_2 = 60$ nm and $R_3 = 70$ nm. Realistic parameters corresponding to Al are used: $m^* = m_e$, $\mu = 10$ eV and $\Delta_0 = 0.34$ meV [32]. The Hamiltonian Equation (A1) is discretized on a square lattice with a=0.1 nm using the Kwant package. In (a) we show the clean case, where the superconductivity is destroyed almost immediately by the magnetic field. In (b) we show the disordered case using the on-site disorder potential $\delta U$ which is randomly sampled from $\delta U \in [-U, U]$ with U=2 eV. The disorder is applied in an outer layer of 5 nm thickness, with the purpose of modelling an oxidized $Al_2O_3$ layer.

In order to understand the magnetic field dependence of the quasiparticle gap, one needs to calculate the Green's functions for the disordered SC shell as a function of $\tilde{A}_\varphi$. The disordered superconductor is characterized by an elastic mean free path $l_e$ and a corresponding diffusive coherence length $\xi_d = \sqrt{l_e \xi_0} \gg l_e$, where $\xi_0 = v_F/\Delta$ is the coherence length in the bulk, clean limit ($v_F$ is the Fermi velocity in the SC). For simplicity, we assume henceforth that the thickness of the superconducting shell d & $\xi_d$, so that the properties of the system can be obtained by calculating the Green's function for the disordered bulk superconductor in magnetic field B and n=0. This problem was considered by Larkin, who showed that within the self-consistent Born approximation the normal and anomalous Matsubara Green's function are given by:

$$G^{(m_J)}(\omega_n, \varepsilon) = \frac{i\omega_n + \overline{G} + Hm_J}{(\Delta + \overline{F})^2 + \varepsilon^2 - (i\omega_n + \overline{G} + Hm_J)^2} \qquad (A4)$$

$$F^{(m_J)}(\omega_n, \varepsilon) = -\frac{\Delta + \overline{F}}{(\Delta + \overline{F})^2 + \varepsilon^2 - (i\omega_n + \overline{G} + Hm_J)^2} \qquad (A5)$$

where H=eB/4m and $m_J$ is the angular momentum eigenvalue and is the eigenvalue of the Hamiltonian:

$$H_0^{SC}\phi(\vec{r}) = \varepsilon\phi(\vec{r}), \text{ where}$$

$$H_0^{SC} = \frac{\hat{p}_z^2}{2m^*} + \frac{\hat{p}_r^2}{2m^*} + \frac{\hat{p}_\varphi^2}{2m^*} - \mu^{(s)}$$

The functions $\overline{G}$ and $\overline{F}$ are determined by the following equations:

$$\overline{G} = \frac{1}{2\tau \overline{m}_J}\sum_{|m_J|<\overline{m}_J}\frac{i\omega_n + \overline{G} + Hm_J}{\sqrt{(\Delta + \overline{F})^2 - (i\omega_n + \overline{G} + Hm_J)^2}} \qquad (A6)$$

$$\overline{F} = \frac{1}{2\tau \overline{m}_J}\sum_{|m_J|<\overline{m}_J}\frac{\Delta + \overline{F}}{\sqrt{(\Delta + \overline{F})^2 - (i\omega_n + \overline{G} + Hm_J)^2}} \qquad (A7)$$

with $\tau$ being the elastic scattering time and $\overline{m}_J \sim p_F R_3$ being the angular momentum cutoff. In the limit $H \to 0$, the leading order corrections to the above equations appear in quadratic order since linear terms vanish due the averaging over $m_J$. Indeed, one can show that the self-consistent solution for $\tau \to 0$ is given by:

$$\overline{G} = \frac{i}{2\tau}\sin z \qquad (A8)$$

$$\overline{F} = \frac{i}{2\tau}\cos z \qquad (A9, A10)$$

$$\frac{\omega_n}{\Delta} = \tan z - \kappa \sin z$$

where $\kappa = 3H^2\tau\langle m_J^2\rangle/\Delta$ is the characteristic scale for the magnetic field effects in the problem. Here $$\langle m_J^2\rangle = \frac{1}{\overline{m}_J}\sum_{|m_J|<\overline{m}_J^2} m_J^2 \sim (p_F R_3)^2.$$

Thus, corrections to the pairing gap are governed by the small parameter $\kappa \ll 1$. In terms of the flux quantum, this condition reads $$\frac{\Phi}{\Phi_0} \ll R_3/\xi_d.$$

Note that disorder suppresses orbital effects of the magnetic field and leads to a weaker dependence of the pairing gap on magnetic field (i.e., quadratic vs linear). In other words, the disordered superconductor can sustain much higher magnetic fields compared to the clean one, see FIG. 20. Finally, the analysis above can be extended to $n \neq 6$. After some manipulations, one finds that:

$$\frac{\Delta(\Phi) - \Delta_0}{\Delta_0} \sim \frac{\xi_d^2}{R_3^2}\left(n - \frac{\Phi}{\Phi_0}\right)^2$$

This estimate is consistent with the numerical calculations, see FIG. 20.

APPENDIX B: Derivation of the Effective Hamiltonian.

In the previous section was derived the Green's function for the disordered superconducting ring. One can now use these results to study the proximity effect of the SC ring on the semiconducting core. Consider here the case when the SC shell is thin $d \sim l_e$ such that $$\frac{\xi_d}{R_3} \ll 1.$$

In this case, one can neglect magnetic field dependence of the self-energy for the entire lobe. (Alternatively, when $\xi_d \sim R_3$ one can neglect magnetic field effect when $$n - \frac{\Phi}{\Phi_0} \ll 1\bigg).$$

Thus, one can use zero field Green's functions for the disordered superconductor to investigate the proximity effect which are obtained by substituting $\omega_n \to \tilde{\omega}_n = \omega_n \eta(\omega_n)$ and $\Delta_0 \to \tilde{\Delta}_0 = \Delta_0 \eta(\omega_n)$ with $\eta(\omega_n) = 1 + \frac{1}{2\tau}\sqrt{\omega_n^2 + \Delta_n^2}$ in the clean Green's functions.

One can now integrate out the superconducting degrees of freedom and calculate the effective self-energy due to the tunneling between semiconductor and superconductor. Using the gauge convention when $\Delta_0$ is real, tunneling Hamiltonian between SM and SC is given by:

$$H_t = \int dr dr' T(r,r') e^{in\Phi/2} \psi^\dagger(r) \psi(r') + H.c. \quad (B1)$$

where r and r' refer to the SM and SC domains, respectively. T(r, r') is the tunneling matrix element between the two subsystems, and $\psi$ and $\psi'$ are the fermion annihilation and creation operators in the corresponding subsystem. One can calculate the SC self-energy due to tunneling to find:

$$\sum^{(SC)}(r, \omega_n) = \Gamma(r) \frac{i\omega_n \tau_0 - \Delta_0[\cos(n\varphi)\tau_x + \sin(n\varphi)\tau_y]}{\sqrt{\omega_n^2 + \Delta_0^2}} \quad (B2)$$

where $\Gamma(r)$ is a quickly decaying function away from $r = R_2$ describing tunneling between the two subsystems. Note that the SC self-energy in this approximation is the same as for a clean superconductor because the ratio of $\tilde{\omega}_n/\tilde{\Delta}_n$ is independent of $\tau$.

The Green's function for the semiconductor can be written as:

$$G^{-1}(\omega_n) = -i\omega_n - H_{SM} - \Sigma^{(SC)}(r, \omega_n) \quad (B3)$$

In order to calculate quasiparticle energy spectrum one has to find the poles of above Green's function.

In the hollow cylinder limit, $\Gamma(r = R_2)$ is a constant and one can find low energy spectrum analytically. Indeed, after expanding Equation (B3) in small $\omega_n$, the quasiparticle poles are determined by the spectrum of the following effective Hamiltonian:

$$H_{eff} = \frac{H_{SM}}{1 + \Gamma/\Delta_0} + \frac{\Gamma}{1 + \Gamma/\Delta_0}[\cos(n\varphi)\tau_x + \sin(n\varphi)\tau_y] = 0 \quad (B4)$$

By comparison with Equation (2), one can establish the correspondence between the renormalized and bare parameters of the semiconductor and proximity-induced gap $\Delta = \Delta_0 \Gamma/(\Delta_0 + \Gamma)$.

APPENDIX C: Effect of Higher $m_j$ States on the Gap

As demonstrated above, states with larger $m_j \neq 6$ have the potential to close the gap and thus limit the extent of the topological phase. Here we provide analytical estimates within the hollow cylinder model for the regions in parameter space that become gapless due to higher $m_j$ states. For a start, consider the finite $m_j$ extension of the BdG Hamiltonian (7):

$$\tilde{H}_{m_j} = \left[\frac{p_z^2}{2m^*} - \mu_{m_j}\right]\tau_z + V_Z\sigma_z + A_{m_j} + C_{m_j}\sigma_z\tau_z + \alpha p_z\sigma_y\tau_z + \Delta\tau_x, \quad (C1)$$

with:

$$\mu_{m_j} = \mu - \frac{1}{8m^* R^2}(4m_j^2 + 1 + \phi^2) - \frac{\alpha}{2R_2} \quad (C2, C3, C4, C5)$$

$$V_Z = \phi\left(\frac{1}{4m^* R_2^2} + \frac{\alpha}{2R_2}\right),$$

$$A_{m_j} = -\frac{\phi m_j}{4m^* R_2^2},$$

$$C_{m_j} = -m_j\left(\frac{1}{2m^* R_2^2} + \frac{\alpha}{R_2}\right),$$

where it is defined that $\phi = n = \Phi(R_2)/\Phi_0$.

Observe from Eq. (C1) that the pairing gap in the different $m_j$ sectors does not necessarily open around zero energy but is shifted by the $\tau_z$ independent terms $A_{m_j} + V_Z\sigma_z$ which act as a Pauli limiting field and lead to pairbreaking effects. In other words, the corresponding $m_j \neq 6$ particle and hole bands have different Fermi momenta which precludes opening a pairing gap in the spectrum.

One can obtain illustrative analytical estimates for the condition when gapless states are present when considering Hamiltonian (C1) in the absence of the pairing term $\Delta\tau_x$ and the spin orbit term $\alpha p_z\sigma_y\tau_z$. Note that disregarding the spin mixing term slightly overestimates the presence of gapless states since the latter allows to open a gap when particle and hole bands of different $\sigma_z$ component mix. In fact, the $\alpha p_z \sigma_y \tau_z$ is crucial to estimate the topological gap in the $m_j = 0$ sector. For $m_j \neq 6$, however, the misalignment of the bands at the Fermi level becomes the dominant effect.

It is possible to estimate the presence of gapless states when both of the following conditions are fulfilled for any $m_j \neq 6$ with spin eigenvalue $\sigma_z = \pm 1$.

$$|A_{m_j} + V_Z\sigma_z| > \beta_1 \Delta \quad (C6)$$

$$-\mu_{m_j} + V_Z\sigma_z + A_{m_j} + C_{m_j}\sigma_z > -\beta_2\Delta, \quad (C7)$$

where $\beta_1$, $\beta_2$ are numerical factors in the interval [0,1]. Condition (C6) determines whether particle and hole band crossing is further away than $\beta_1 \Delta$ from the chemical potential. Assuming a maximally efficient pairing with corresponding gap $\sim \Delta$ can be captured by setting $\beta_1 = 1$. The condition (C7) concerns the position of the bottom of the band of a particular $m_j$ and spin state. For $\Delta = 0$ the band is at least partially occupied when (C7) holds with $\beta_2 = 0$. In the presence of paring the particle and hole bands repel each other, which shifts the bottom of the particle band to higher energies as compared to the $\Delta = 0$ case. This effect can be qualitatively captured by choosing a finite $\beta_2 < 1$.

One can understand the generally finite extent of the gaped regions in the $\alpha$-$\mu$ plane by observing that condition (C6) is either met for sufficiently large $m_j$ or sufficiently large $\alpha$ (when $m_j$ is kept constant). At the same time, large $m_j$ states generally violate condition (C7) since the bottom of the band is shifted up $\propto m_j^2$ which needs to be compensated by sufficiently large $\mu$. It is therefore expected to find gapless states for large $\mu$ (which enable large $m_j$) or very large $\alpha$ which fulfill condition (C6) while still being compatible with condition (C7).

Figure 21:
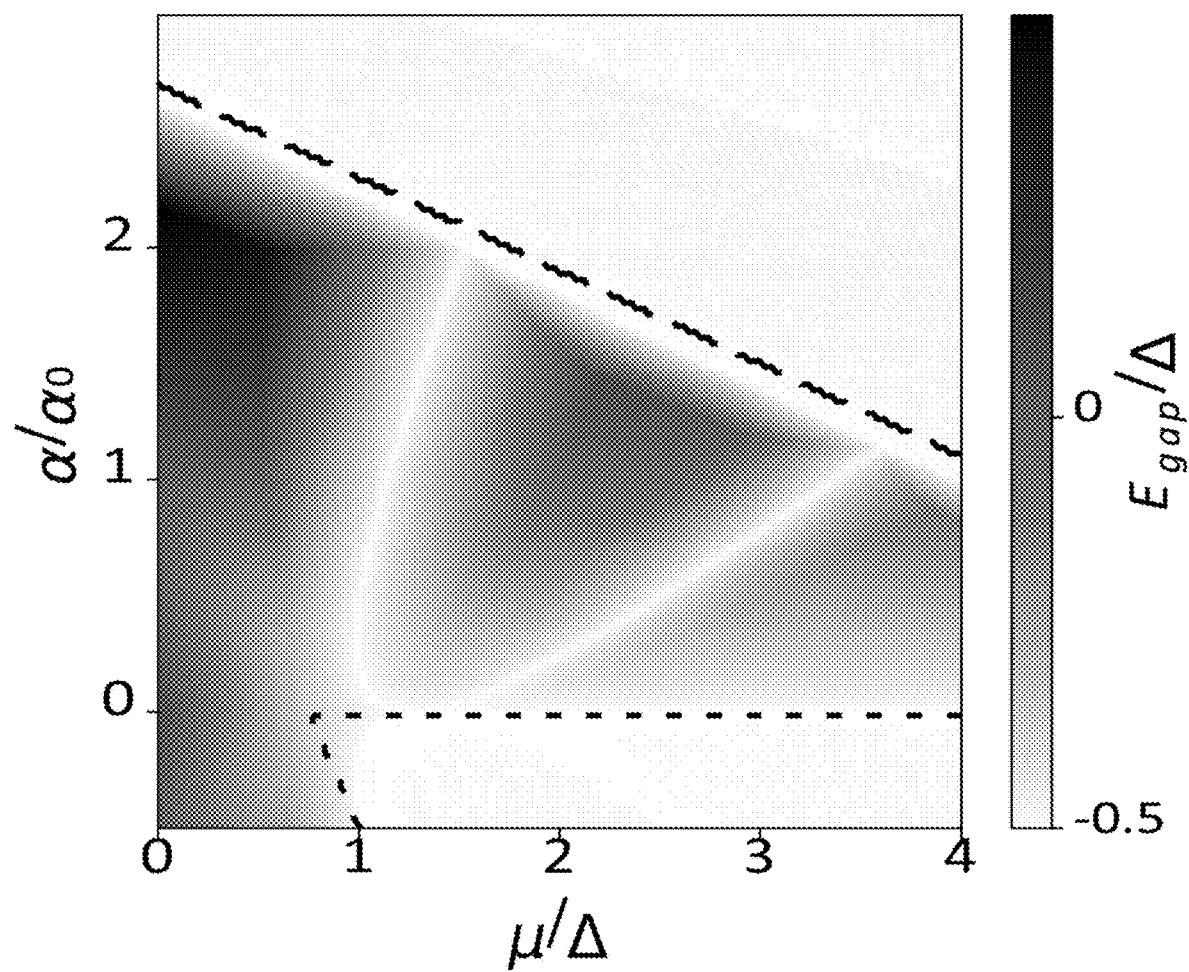
FIG. 21 shows a phase diagram of a hollow cylinder model.

These considerations are validated in FIG. 21, which shows the good agreement between the boundaries predicated by Equations (C6) and (C7) with the numerical simulation of the gap reported in FIG. 16 (using $\beta_1 = 1$ and $\beta_2 = \frac{1}{2}$). In particular, the figure reveals that the $m_j = \pm 2$ sectors are those which most limit the extent of the topological phase at large $\mu$ and $\alpha$. Note that the slope of the blue line in FIG. 21 is independent of $\beta_1$ and $\beta_2$.

FIG. 21 shows the phase diagram of the hollow cylinder model as a function of $\mu$ and $\alpha$, as in the left panel of FIG. 16. The contour lines illustrate the analytical estimate for the boundaries of the gapped region of the phase diagram. The horizontal and sloped dotted lines at the bottom of the figure are determined by condition (C6) and (C7) for $m_j = \pm 1$, while the upper dashed line corresponds to condition (C7) in the $m_j = \pm 2$ sector.

APPENDIX D: Details About the Numerical Simulations of Clean Systems.

From the numerical perspective, the solution of Equation (B3) for the poles is not optimal given that one has to solve the non-linear equation for $\omega$. Therefore, one can employ an alternative approach in which the SM is coupled to an artificial clean superconductor. One can use the parameters for the superconductor and tunneling Hamiltonian such that in the end Equation (B3) is reproduced after integrating out the SC degrees of freedom.

To obtain the correct self-energy Equation (B2), the thickness of the simulated clean superconductor needs to be made significantly larger than the coherence length. This is achieved by using $R_3 = 3$ μm for the simulations shown in FIGS. 17 and 18. All parameters are chosen independent of $r$ except:

$$\Delta(r) = \begin{cases} 0 & r < R_2 \\ \Delta & r \geq R_2 \end{cases}, \tag{D1}$$

$$\alpha = \begin{cases} \alpha & r < R_2 \\ 0 & r \geq R_2 \end{cases},$$

$$A_\varphi = \begin{cases} \Phi(R_2) r / (2\pi R_2^2) & r < R_2 \\ \Phi(R_2) / (2\pi r) & r \geq R_2 \end{cases}.$$

Here, $\Phi(R_2)$ corresponds to the flux penetrating the semiconducting core. In accordance to the arguments above, we simulate the superconductor without magnetic field. It is possible to solve Equations (6) with the finite difference method, using a discretization length of 5 nm.

APPENDIX E: Full Cylinder Semiconductor Model in the Small Radius Limit.

In this section there is considered the full cylinder limit discussed previously ($R_1 \to 0$ in FIGS. 1A and 15). Using an effective model it is demonstrated analytically that the topological phase exists when exactly one superconducting flux quantum penetrates the core. The results of this section are complimentary to the numerical calculations of the main text above. The effective Hamiltonian for the model is given by:

$$\tilde{H}_{BdG} = \left( \frac{p_z^2}{2m^*} - \frac{1}{2m^* r} \frac{\partial}{\partial r} r \frac{\partial}{\partial r} - \mu \right) \tau_z + \tag{E1}$$

$$\frac{1}{2m^* r^2} \left( m_J - \frac{1}{2}\sigma_z - \frac{1}{2} n \tau_z + \frac{b}{2} \frac{r^2}{R_2^2} \tau_z \right)^2 \tau_z -$$

$$\frac{\alpha}{r} \sigma_z \tau_z \left( m_J - \frac{1}{2}\sigma_z - \frac{1}{2} n \tau_z + \frac{b}{2} \frac{r^2}{R_2^2} \tau_z \right) + \alpha p_z \sigma_y \tau_z + \Delta(r) \tau_x.$$

and, unlike in the hollow cylinder limit, one has to solve the radial part of Equation (E1). There was introduced the dimensionless variable $b = eBR_2^2 = \pi B B_2^2/\Phi_0$. The proximity-induced gap $\Delta(r)$ must vanish in the middle of the core, $\lim_{r \to 0} \Delta(r) = 0$. We consider below the case when $\Delta(r) = \Delta r/R_2$, although the particular choice for the radial dependence of $\Delta(r)$ is not important for the demonstration of the existence of the topological phase.

Consider the analysis restricted to the $m_J = 0$ sector for $n=1$ in the limit $$\frac{1}{m^* R_2^2} \gg \alpha / R_2.$$

In this case, the problem at hand can be simplified since the Hamiltonian (7) becomes separable at $\alpha \to 0$ and effect of spin-orbit can be included perturbatively. In the limit $\alpha \to 0$, the electron spin is conserved and the Bogoliubov transformation diagonalizing Hamiltonian (E1) can written as:

$$\gamma_{\lambda,pz,\sigma} = \int_0^{R_2} r dr [U_{\lambda,pz,\sigma}(r) \psi_{pz,\sigma}(r) + V_{\lambda,pz,-\sigma}(r) \psi_{pz,-\sigma}^\dagger(r)] \tag{E2}$$

where the transformation coefficients $U_{\lambda,pz,\sigma}(r)$ and $V_{\lambda,pz,\sigma}(r)$ are given by the solution of Equation (E1). Neglecting the spatial dependence of $\Delta(r)$, the functions $U_{\lambda,pz,\sigma}(r)$ and $V_{\lambda,pz,\sigma}(r)$ can be approximately written as:

$$U\lambda, pz, \sigma(r) = u\lambda, \sigma(pz) f\lambda, \sigma(r) \tag{E3}$$

$$V\lambda, pz, \sigma(r) = v\lambda, \sigma(pz) f\lambda, \sigma(r) \tag{E4}$$

where the single-particle wave functions $f_{\lambda,\sigma}(r)$ are defined by the following radial Schrodinger equation:

$$-\frac{1}{2m^*} \left( \frac{1}{r} \frac{\partial}{\partial r} r \frac{\partial}{\partial r} - \frac{1+\sigma_z}{2r^2} - \frac{b^2}{4R_2^2} \frac{r^2}{R_2^2} + \frac{b}{R_2^2} \frac{1+\sigma_z}{2} \right) f_{\lambda,\sigma}(r) = \tag{E5}$$

$$\varepsilon_{\lambda,\sigma} f_{\lambda,\sigma}(r)$$

The linear term in b represents a constant energy shift:

$$\delta_\sigma = \begin{cases} \frac{b}{2m^* R_2^2} & \sigma = \uparrow \\ 0 & \sigma = \downarrow \end{cases}, \tag{E6}$$

After introducing the dimensionless coordinate $x = r/R_2$ and the dimensionless energies $\kappa_{\lambda,\sigma} = 2m^* R_2^2 (\varepsilon_{\lambda,\sigma} + \delta_\sigma)$, the above equation becomes:

$$\left(-\frac{1}{x}\frac{\partial}{\partial x}x\frac{\partial}{\partial x}+\frac{1+\sigma_z}{2x^2}+\frac{b^2}{4}x^2\right)f_{\lambda,\sigma}(x)=\kappa_{\lambda,\sigma}f_{\lambda,\sigma}(x) \quad (E7)$$

The normalized eigenstates of this equation, satisfying the boundary condition $f_{\lambda,\sigma}(x=1)=0$, are:

$$f_{\lambda,\uparrow}(r)=C_{\lambda\uparrow}R_2^{-1}xe^{-x^2/4}{}_1F_1\left(1-\frac{\kappa_{\lambda\uparrow}}{2b},2,\frac{x^2}{2}\right) \quad (E8)$$

$$f_{\lambda,\downarrow}(r)=C_{\lambda\downarrow}R_2^{-1}e^{-x^2/4}{}_1F_1\left(\frac{1}{2}-\frac{\kappa_{\lambda\downarrow}}{2b},1,\frac{x^2}{2}\right). \quad (E9)$$

Here, ${}_1F_1$ is the is the Kummer confluent hypergeometric function and the coefficients $C_{\lambda,\sigma}$ are determined by the normalization condition:

$$\int_0^{R_2}|f_{\lambda,\sigma}(r)|^2 r\,dr=1. \quad (E10)$$

The corresponding eigenvalues are:

$$\varepsilon_{\lambda,\sigma}=\frac{\kappa_{\lambda\sigma}^2}{2m^*R_2^2}-\delta_\sigma \quad (E11)$$

where $\kappa_{\lambda,\sigma}$ are zeros of the appropriate Kummer confluent hypergeometric function for the two spins. Taking all into account, for b=1 and n=1 the lowest eigenvalues of Equation (E5) are:

$$\varepsilon_{1,\uparrow}\approx\frac{13.77}{2m^*R_2^2},\quad \varepsilon_{1,\downarrow}\approx\frac{5.84_{10}}{2m^*R_2^2} \quad (E12, E13)$$
$$\varepsilon_{2,\uparrow}\approx\frac{48.30}{2m^*R_2^2},\quad \varepsilon_{2,\downarrow}\approx\frac{30.55}{2m^*R_2^2}.$$

Note that different values of b will affect the numerical coefficients reported above.

In the limit $$\frac{1}{m^*R_2^2}\gg\alpha/R_2,$$

$\Delta$, one can project the system to the lowest energy manifold (i.e. $\lambda$=1) and integrate over radial coordinate. After some algebra, the effective Hamiltonian takes the simple form (up to a constant):

$$\tilde{H}_{BdG}=\left(\frac{p_z^2}{2m^*}-\tilde{\mu}\right)\tau_z+\tilde{V}_Z\sigma_z+\tilde{\alpha}p_z\sigma_y\tau_z+\tilde{\Delta}\tau_x$$

where the effective parameters are given by:

$$\tilde{\mu}=\mu-\frac{\varepsilon_{1,\uparrow}+\varepsilon_{1,\downarrow}}{2}-\frac{\alpha}{2R_2}\left(A_\uparrow-\frac{B_\uparrow-B_\downarrow}{2}\right) \quad (E14)$$

$$\tilde{V}_Z=\frac{\varepsilon_{1,\uparrow}-\varepsilon_{1,\downarrow}}{2}+\frac{\alpha}{2R_2}\left(A_\uparrow-\frac{B_\uparrow+B_\downarrow}{2}\right) \quad (E15, E16, E17)$$

$$\tilde{\alpha}=\alpha C,$$
$$\tilde{\Delta}=\Delta D.$$

with numerical constants $A_\sigma$, $B_\sigma$, C, D given in terms of the overlap integrals:

$$A_\sigma=\int_0^1 |f_{1,\sigma}(x)|^2\,dx=\begin{cases}2.056\ldots & \sigma=\uparrow\\ 3.521\ldots & \sigma=\downarrow\end{cases}, \quad (E18, E19, E20, E21)$$

$$B_\sigma=\int_0^1 x^2|f_{1,\sigma}(x)|^2\,dx=\begin{cases}0.552\ldots & \sigma=\uparrow\\ 0.423\ldots & \sigma=\downarrow\end{cases}$$

$$C=\int_0^1 f_{1,\uparrow}(x)f_{1,\downarrow}(x)\,dx=0.93\ldots,$$

$$D=\int_0^1 x^2 f_{1,\uparrow}(x)f_{1,\downarrow}(x)\,dx=0.465\ldots.$$

One can notice that the Zeeman term remains finite at b=1 (i.e. one flux quantum) in contrast to the hollow cylinder model. As mentioned in the main text, this is because the semiconducting states are distributed through the semiconducting core rather than localized at r=$R_2$, so that the flux cannot perfectly cancel the effect of the winding number.

Thus it has been shown that full cylinder model also maps onto Majorana nanowire model (e.g. of Lutchyn et al) and supports topological superconducting phase. The topological quantum phase transition from the topologically trivial (i.e. s-wave) to non-trivial (i.e. p-wave) phases occurs at:

$$|\tilde{V}_Z|=\sqrt{\tilde{\mu}^2+\tilde{\Delta}^2}. \quad (E22)$$

Note that this has only considered $m_J$=0 sector. To investigate other $m_J$ sectors and make sure that quasiparticle gap does not close in the topological phase, this can be done numerically, as shown previously in the main text.

APPENDIX F: Topological Phase Transition.

Figure 22:
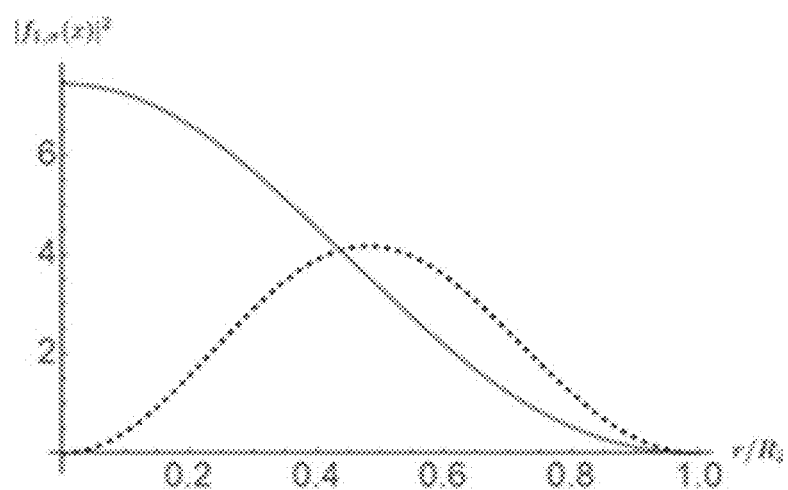
FIG. 22 shows a probability density for lowest energy spin-up and spin-down modes.

FIG. 22 shows probability density for the lowest-energy spin-up (dashed) and spin-down (solid) modes.

Figure 18:
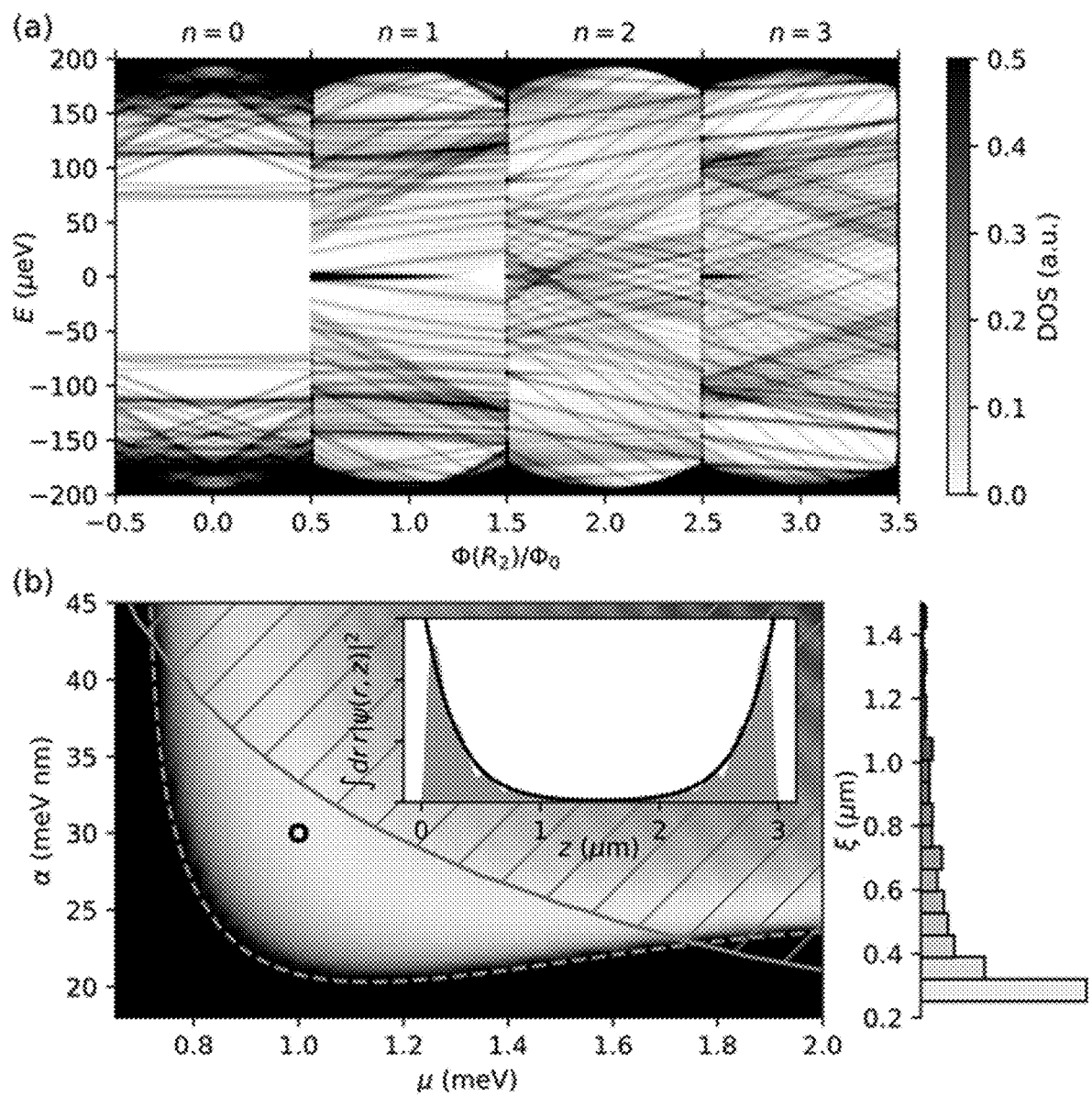
FIG. 18 shows the evolution of local density states at the end of a finite wire.
Figure 23:
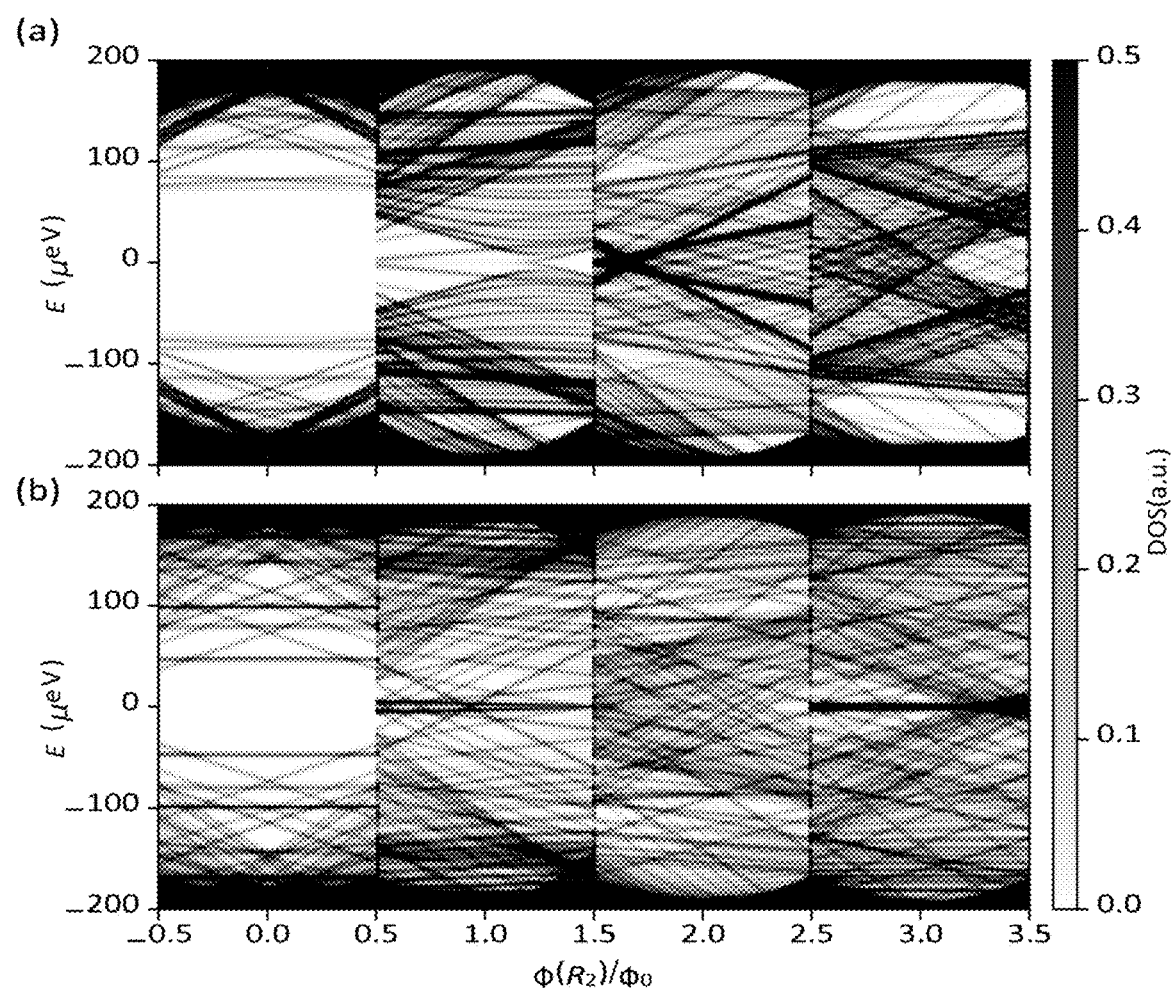
FIG. 23 shows local density states in the middle of a wire.

FIG. 23 shows (a) DOS in the middle of the wire as a function of flux for the same parameters as in FIG. 18(*b*), and (b) DOS at the end of the wire as a function of flux for $\mu$=1.5 meV and $\alpha$=40 meVnm.

In order to understand the topological phase transition within as a function of magnetic flux within the same lobe, it's useful to study the bulk DOS calculated, for example, in the middle of the wire. Consider the n=1 lobe in FIG. 23(*a*) where the topological phase transition manifests itself by closing of the bulk. It's also enlightening to compare the bulk DOS and local DOS at the ends of the wire shown in FIG. 18. One may notice the asymmetry with respect to the center of the lobes which follows from the different dependence of the semiconducting and superconducting states on magnetic field.

This asymmetry depends on parameters and in FIG. 23(*b*) is shown the boundary DOS for a different set, in which the zero bias peaks extend throughout the entire n=1 and n=3 lobes. Note, however, that according to FIG. 17(*a*) the system is gapless for this parameters at $\Phi(R_2)=\Phi_0$. However, as discussed in relation to FIG. 19A (a), the rotational-symmetry-breaking perturbations (e.g. disorder) may lead to gap opening for $m_J\neq 6$ states and therefore stabilize the topological phase.

APPENDIX G: Details about the Numerical Simulations of Disordered Systems.

Figure 24A:
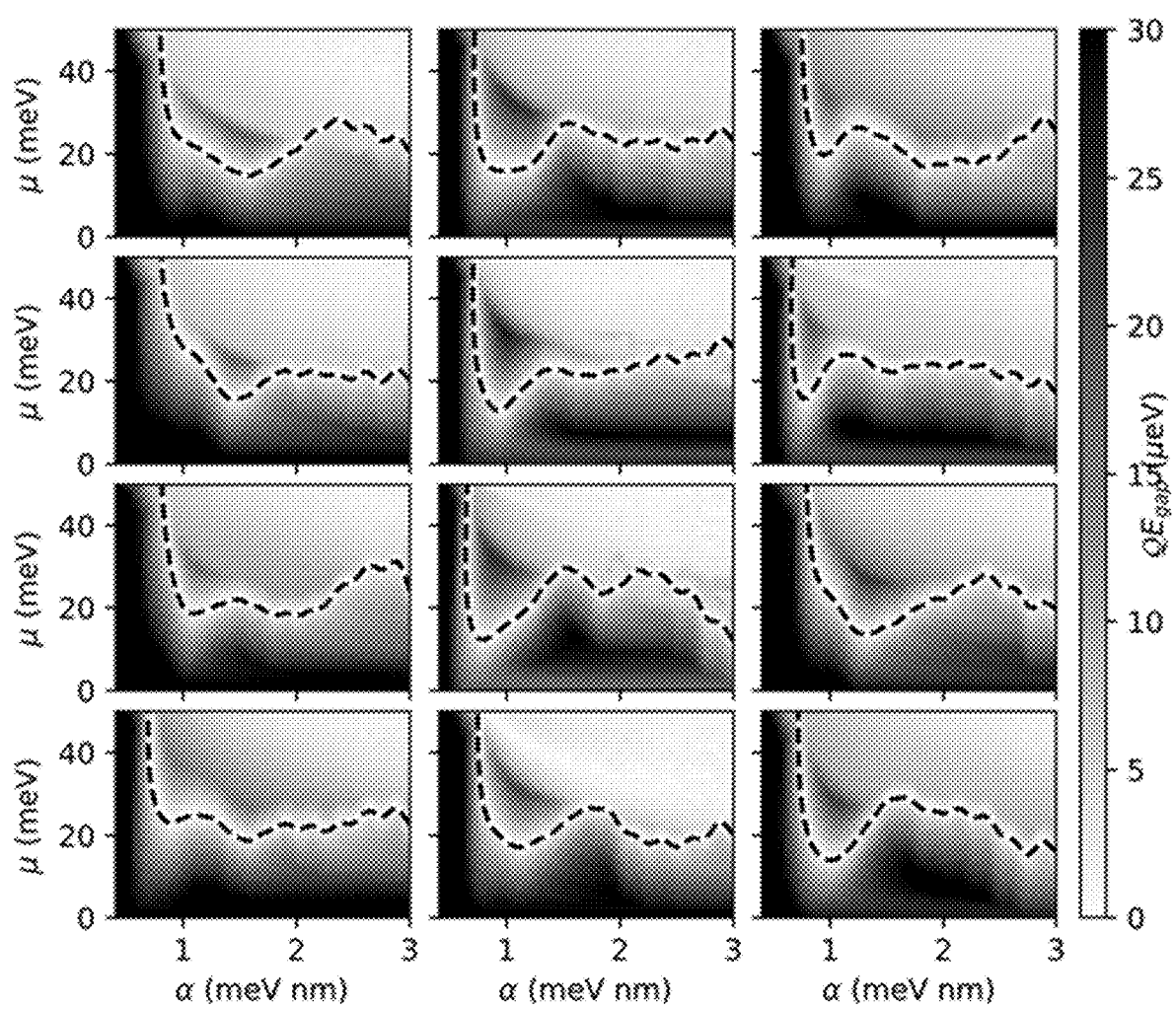
FIG. 24A shows phase diagrams for different disorder realizations.
Figure 24B:
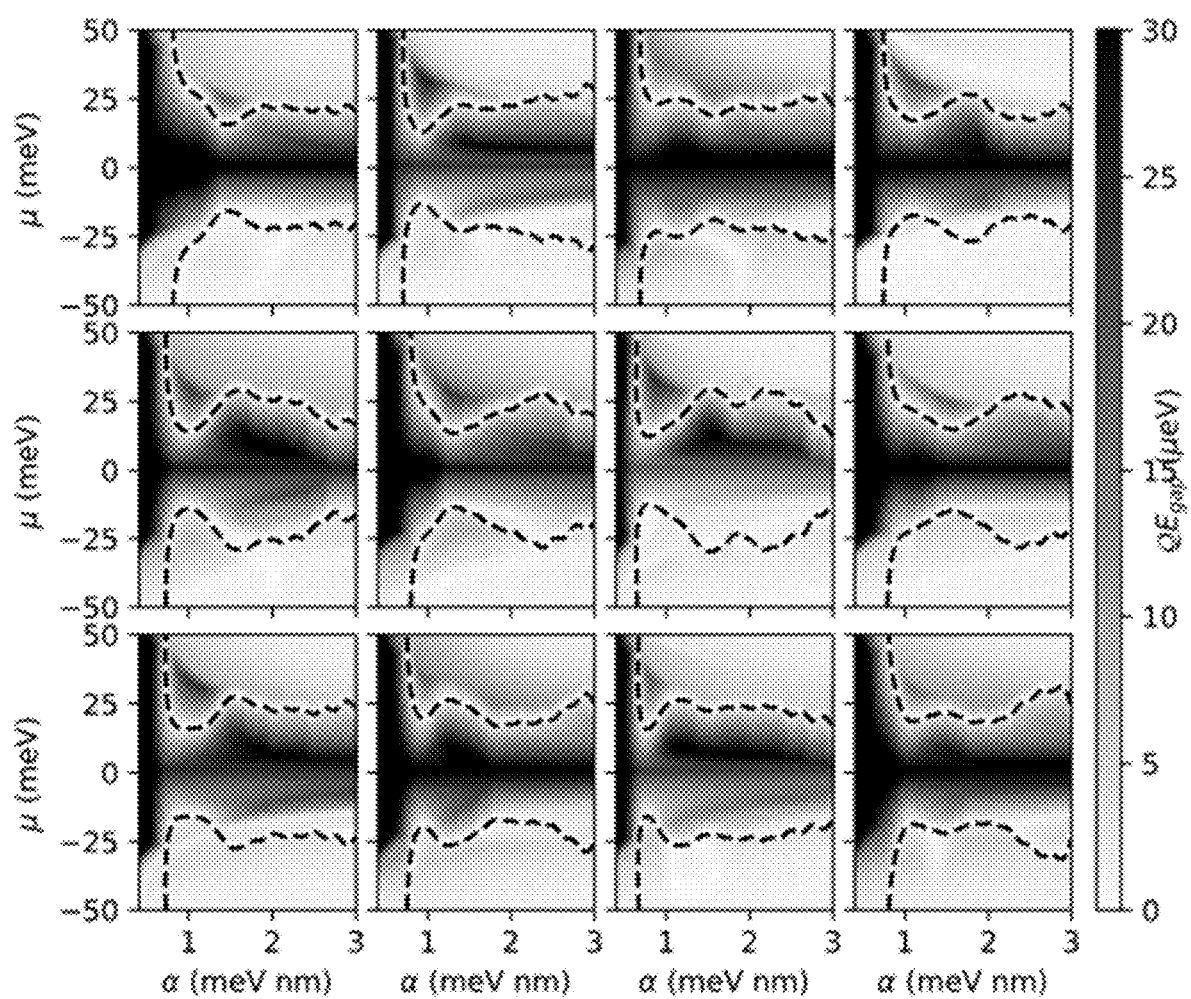
FIG. 24B shows further phase diagrams for different disorder realizations.

For the simulations with disorder in FIGS. 19A-B, the Kwant package has been used for discretizing the Hamiltonian Equation (2) on a 2D square lattice, using a lattice spacing of 10 nm. The system is assumed to be translation-invariant along the z direction, with the disorder configuration repeating along the z-axis. This trick is required since a full 3D simulation would be computationally too demanding. To accommodate to the higher computational cost we use a smaller $R_3$ of 1.5 µm in these simulations. FIG. 24A shows phase diagrams for different disorder realizations used to obtain the average in FIG. 19A. FIG. 24B shows phase diagrams for different disorder realizations used to obtain the average in FIG. 19B.

CONCLUSION

It will be appreciated that the above embodiments have been described by way of example only.

More generally, according to one definition of the first aspect of the present disclosure there may be provided a device comprising one or more semiconductor-superconductor nanowires, each comprising a length of semiconductor material and a coating of superconductor material coated on the semiconductor material; wherein each of one, some or all of the nanowires is a full-shell nanowire, the superconductor material being coated around a full perimeter of the semiconductor material along some or all of the length of the semiconductor material; and wherein the device is operable to induce at least one Majorana zero mode, MZM, in one or more active ones of the nanowires including at least one or more of the full-shell nanowires by application of a magnetic field component parallel to the active nanowires.

In embodiments, the device may be operable to induce the MZMs at least by application of the magnetic field component from outside the device.

The device may comprise a substrate and one or more layers formed over the substrate, wherein the nanowires may be formed in one or more of said layers.

In embodiments, one, some or all of the full-shell nanowires may be vertical relative to the substrate. The device may comprise at least one layer of filler material disposed between the vertical nanowires to mechanically support the vertical nanowires.

In embodiments one, some or all of the full-shell nanowires may be horizontal in the plane of the substrate.

In embodiments, the device may further comprise one or more layers of circuitry formed in one or more of said layers, for connecting the nanowires together into quantum structures, controlling the nanowires or quantum structures, and/or taking measurements from the nanowires or quantum structures.

In embodiments, one or more of the nanowires other than active nanowires may be arranged as conductive vias between layers of the circuitry or a layer of the circuitry an exterior of the device.

In embodiments, the one or more layers of circuitry may comprise a semiconducting network that connects the active nanowires, for opening or closing tunnel junctions in the semiconducting network.

In embodiments, the device may comprise one or more qubits, each qubit comprising a plurality of the active nanowires, wherein one, some or all of the plurality of nanowires in each qubit are full-shell nanowires. In some such embodiments, each of the qubits may be either: a tetron qubit in which said plurality is four, or hexon qubit in which said plurality is six.

In embodiments, each qubit may comprises a horizontal superconducting island formed in a plane paralleled to the substrate, wherein the superconducting island is divided into arms each joining the lower end of a respective one of the plurality of vertical nanowires in the qubit to a common point of the superconducting island. In some such embodiments the arms may take the form of concentric spiral arms.

In embodiments, the superconducting island of each qubit may be formed of the same superconductor material as the coating of the nanowires.

According to another definition of the first aspect there may be provided a method as defined of operating the disclosed device, the method comprising: applying the magnetic field component parallel to the active nanowires in order to induce the at least one MZM in each of the active nanowires; wherein said inducement comprises a winding of a superconducting phase of the superconductor material, introduced by a magnetic flux of the magnetic field component through the active nanowires, coupling to the magnetic field component in order to induce a topological phase by means of an orbital effect of the magnetic field component. The coupling acts as if a strong Zeeman field was present.

The method may further comprise refrigerating the device to induce superconductivity in the superconductor material.

According to one definition of the second aspect there may be provided a device comprising: a substrate defining a plane; one or more layers formed over the substrate; and one or more semiconductor-superconductor nanowires formed in one or more of the layers; wherein each of the nanowires comprises a length of semiconductor material and a coating of superconductor material coated on at least part of the semiconductor material; and wherein each of one, some or all of the nanowires is vertical relative to the plane of the substrate.

In embodiments each of one, some or all of the nanowires may be a full-shell nanowire, the superconductor material being coated around a full perimeter of the semiconductor material along some or all of the length of the semiconductor material.

In embodiments, the device may be operable to induce at least one MZM in one or more active ones of the nanowires by application of a magnetic field component parallel to the active nanowires.

In embodiments, an MZM may be formed at each end of each active nanowire.

In embodiments, the active nanowires may comprise one or more of the full-shell nanowires.

In embodiments the device may comprise one or more qubits, each qubit comprising a plurality of the active nanowires.

In embodiments one, some or all of the plurality of nanowires in each qubit may be full-shell nanowires.

In embodiments one, some or all of the qubits may be MZM-based qubits. In some such embodiments each of one, some or all of the MZM-based qubits may be either: a tetron qubit in which said plurality is four, or hexon qubit in which said plurality is six.

In embodiments each qubit may comprises a horizontal superconducting island formed in a plane paralleled to the substrate, wherein the superconducting island is divided into arms each joining the lower end of a respective one of the plurality of vertical nanowires in the qubit to a common point of the superconducting island. In some such embodiments the arms may take the form of concentric spiral arms.

In embodiments the device may further comprise one or more layers of circuitry formed in one or more of said layers, for connecting the nanowires together into quantum structures, controlling the nanowires or quantum structures, and/or taking measurements from the nanowires or quantum structures.

In embodiments, one or more of non-active ones the nanowires may be arranged as conductive vias between layers of the circuitry or a layer of the circuitry an exterior of the device.

In embodiments one, some or all of the qubits may be transmon or gateman based qubits.

In embodiments, the layers of the wafer may comprise at least one layer of filler material disposed between the vertical nanowires to mechanically support the vertical nanowires.

According to another definition of the second aspect, there may be provided a method of fabricating a device, the method comprising: providing a substrate; growing vertical lengths of semiconductor material perpendicular to the substrate; subsequently coating at least a part of each of at least some of the vertical lengths of semiconductor material with a superconductor material, thus forming vertical semiconductor-superconductor nanowires; and leaving the vertical nanowires in the vertical orientation relative to the substrate upon finishing the device.

In embodiments the method may comprise, subsequent to said growth, forming a circuit around the vertical nanowires to form one or more qubits, each qubit comprising a plurality of the vertical nanowires.

In embodiments said finishing of the device may comprise any one, more or all of: forming a gate or contact at the top end of each of some of or all of the vertical nanowires; depositing a filler material between the vertical nanowires; and/or packaging the device in an integrated circuit package.

In embodiments said growth may be performed using a vapour-liquid-solid, VLS, growth process.

In embodiments the method may be used to fabricate a device in accordance with any embodiment of the first or second aspect disclosed herein.

In either the first or second aspect, by way of an example implementation, the semiconductor material may be InAS or InSb. The superconductor material may be Al or Nb.

The superconducting island connecting the nanowires of each qubit may be formed of the same superconductor material as the coating of the nanowires. The filler material is a plastic or a wax. The gates, contacts and/or circuitry between nanowires may be formed from a metal or semiconductor. The at least one MZM induced in each active nanowire may be a pair of MZMs. In the case of the vertical qubit designs, the lower of the pair may by the operative MZM of the qubit. The device may be packaged in an integrated circuit package.

In embodiments there may be provided a quantum computer comprising: the disclosed device of any embodiment of the first or second aspect, and an electromagnet arranged to apply the magnetic field component parallel to the active nanowires. The quantum computer may comprise a refrigerated chamber in which the device is placed in order to induce superconductivity in the superconductor. Other applications or variants of the disclosed techniques or structures may become apparent to a person skilled in the art once given the disclosure herein. The scope of the present disclosure is not limited by the above described embodiments.

The invention claimed is:

1. A device comprising:
a substrate defining a plane;
one or more layers formed over the substrate; and
one or more semiconductor-superconductor nanowires formed in one or more of the layers;
wherein each of the nanowires comprises a length of semiconductor material and a coating of superconductor material coated on at least part of the semiconductor material; and
wherein each of one, some or all of the nanowires is vertical relative to the plane of the substrate,
wherein the device is operable to induce at least one MZM in one or more active ones of the nanowires by application of a magnetic field component parallel to the active nanowires.

2. The device of claim 1, wherein each of one, some or all of the nanowires is a full-shell nanowire, the superconductor material being coated around a full perimeter of the semiconductor material along some or all of the length of the semiconductor material.

3. The device of claim 2, wherein:
the device is operable to induce at least one MZM in one or more active ones of the nanowires by application of a magnetic field component parallel to the active nanowires; and
the active nanowires comprise one or more of the full-shell nanowires.

4. The device of claim 1, wherein an MZM is formed at each end of each active nanowire.

5. The device of claim 1, further comprising one or more layers of circuitry formed in one or more of said layers, for connecting the nanowires together into quantum structures, controlling the nanowires or quantum structures, and/or taking measurements from the nanowires or quantum structures.

6. The device of claim 5, wherein one or more of non-active ones the nanowires are arranged as conductive vias between layers of the circuitry or a layer of the circuitry an exterior of the device.

7. A device comprising:
a substrate defining a plane;
one or more layers formed over the substrate; and
one or more semiconductor-superconductor nanowires formed in one or more of the layers;
wherein each of the nanowires comprises a length of semiconductor material and a coating of superconductor material coated on at least part of the semiconductor material; and
wherein each of one, some or all of the nanowires is vertical relative to the plane of the substrate,
wherein the device comprises one or more qubits, each qubit comprising a plurality of the active nanowires.

8. The device of claim 7, wherein one, some or all of the plurality of nanowires in each qubit are full-shell nanowires.

9. The device of claim 7, wherein one, some or all of the qubits are MZM-based qubits.

10. The device of claim 9, wherein each of one, some or all of the MZM-based qubits is either: a tetron qubit in which said plurality is four, or hexon qubit in which said plurality is six.

11. The device of claim 7, wherein each qubit comprises a horizontal superconducting island formed in a plane paralleled to the substrate, wherein the superconducting island is divided into arms each joining the lower end of a respective one of the plurality of vertical nanowires in the qubit to a common point of the superconducting island.

12. The device of claim 11, wherein the arms take the form of concentric spiral arms.

13. The device of claim 7, wherein one, some or all of the qubits are transmon or gatemon based qubits.

14. A device comprising:
- a substrate defining a plane;
- one or more layers formed over the substrate; and
- one or more semiconductor-superconductor nanowires formed in one or more of the layers;
- wherein each of the nanowires comprises a length of semiconductor material and a coating of superconductor material coated on at least part of the semiconductor material; and
- wherein each of one, some or all of the nanowires is vertical relative to the plane of the substrate,
- wherein the layers of the wafer comprise at least one layer of filler material disposed between the vertical nanowires to mechanically support the vertical nanowires.

* * * * *